United States Patent
Lee et al.

(10) Patent No.: US 10,453,703 B2
(45) Date of Patent: Oct. 22, 2019

(54) METHOD OF TREATING SILICON WAFERS TO HAVE INTRINSIC GETTERING AND GATE OXIDE INTEGRITY YIELD

(71) Applicant: SunEdison Semiconductor Limited (UEN201334164H), Singapore (SG)

(72) Inventors: Young Jung Lee, Chungcheongnam-do (KR); Jae-Woo Ryu, Chesterfield, MO (US); Byung Chun Kim, Chungnam (KR); Robert J. Falster, Woodstock (GB); Soon Sung Park, Chungnam (KR); Tae Hoon Kim, Chungnam (KR); Jun Hwan Ji, Chungnam (KR); Carissima Marie Hudson, St. Charles, MO (US)

(73) Assignee: SunEdison Semiconductor Limited (UEN201334164H), Singapore (SG)

( * ) Notice: Subject to any disclaimer, the term of this patent is extended or adjusted under 35 U.S.C. 154(b) by 26 days.

(21) Appl. No.: 15/840,178

(22) Filed: Dec. 13, 2017

(65) Prior Publication Data
US 2018/0182641 A1    Jun. 28, 2018

Related U.S. Application Data

(60) Provisional application No. 62/439,621, filed on Dec. 28, 2016.

(51) Int. Cl.
*C30B 29/06* (2006.01)
*H01L 21/322* (2006.01)
(Continued)

(52) U.S. Cl.
CPC .......... *H01L 21/3225* (2013.01); *C30B 29/06* (2013.01); *C30B 33/00* (2013.01);
(Continued)

(58) Field of Classification Search
CPC ..... C30B 29/06; C30B 15/203; C30B 15/206; C30B 33/02; C30B 15/00
See application file for complete search history.

(56) References Cited

U.S. PATENT DOCUMENTS

| | | |
|---|---|---|
| 4,501,060 A | 2/1985 | Frye et al. |
| 4,755,865 A | 7/1988 | Wilson et al. |

(Continued)

FOREIGN PATENT DOCUMENTS

| | | |
|---|---|---|
| EP | 0939430 A2 | 1/1999 |
| EP | 1624482 A2 | 2/2006 |

(Continued)

OTHER PUBLICATIONS

Gamble, H.S. et al., Low-loss CPW Lines on Surface Stabilized High-Resistivity Silicon, IEEE Microwave and Guided Wave Letters, Oct. 1999, pp. 395-397, vol. 9, No. 10.

(Continued)

*Primary Examiner* — Tony Tran
(74) *Attorney, Agent, or Firm* — Armstrong Teasdale LLP

(57) ABSTRACT

The disclosure is directed to a method to recover the gate oxide integrity yield of a silicon wafer after rapid thermal anneal in an ambient atmosphere comprising a nitrogen containing gas, such as $NH_3$ or $N_2$. Generally, rapid thermal anneals in an ambient atmosphere comprising a nitrogen containing gas, such as $NH_3$ or $N_2$ to thereby imprint an oxygen precipitate profile can degrade the GOI yield of a silicon wafer by exposing as-grown crystal defects (oxygen precipitate) and vacancies generated by the silicon nitride film. The present invention restores GOI yield by stripping the silicon nitride layer, which is followed by wafer oxidation, which is followed by stripping the silicon oxide layer.

15 Claims, 11 Drawing Sheets

(51) Int. Cl.
*H01L 29/36* (2006.01)
*H01L 21/324* (2006.01)
*C30B 33/00* (2006.01)
*C30B 33/02* (2006.01)
*C30B 33/08* (2006.01)
*H01L 21/00* (2006.01)
*H01L 21/3065* (2006.01)
*H01L 21/304* (2006.01)
*H01L 21/306* (2006.01)

(52) U.S. Cl.
CPC ............ *C30B 33/005* (2013.01); *C30B 33/02* (2013.01); *C30B 33/08* (2013.01); *H01L 21/00* (2013.01); *H01L 21/324* (2013.01); *H01L 29/36* (2013.01); *H01L 21/304* (2013.01); *H01L 21/3065* (2013.01); *H01L 21/30604* (2013.01)

(56) References Cited

U.S. PATENT DOCUMENTS

| | | | |
|---|---|---|---|
| 4,968,384 | A | 11/1990 | Asano |
| 5,189,500 | A | 2/1993 | Kusunoki |
| 6,043,138 | A | 3/2000 | Ibok |
| 6,191,009 | B1 | 2/2001 | Tamatsuka et al. |
| 6,346,459 | B1 | 2/2002 | Usenko et al. |
| 6,373,113 | B1 | 4/2002 | Gardner et al. |
| 6,562,127 | B1 | 5/2003 | Kud et al. |
| 6,624,047 | B1 | 9/2003 | Sakaguchi et al. |
| 7,311,775 | B2 | 12/2007 | Kusaba et al. |
| 7,387,676 | B2 | 6/2008 | Ammon et al. |
| 7,732,352 | B2 | 6/2010 | Mun et al. |
| 7,759,227 | B2 | 7/2010 | Maeda et al. |
| 7,868,419 | B1 | 1/2011 | Kerr et al. |
| 7,879,699 | B2 | 2/2011 | Schulze et al. |
| 7,915,706 | B1 | 3/2011 | Kerr et al. |
| 8,058,137 | B1 | 11/2011 | Or-Bach et al. |
| 8,076,750 | B1 | 12/2011 | Kerr et al. |
| 8,187,954 | B2 | 5/2012 | Hayamizu et al. |
| 8,466,036 | B2 | 6/2013 | Brindle et al. |
| 8,481,405 | B2 | 7/2013 | Arriagada et al. |
| 8,796,116 | B2 | 8/2014 | Grabbe et al. |
| 8,846,493 | B2 | 9/2014 | Libbert et al. |
| 8,859,393 | B2 | 10/2014 | Ries et al. |
| 9,202,711 | B2 | 12/2015 | Liu et al. |
| 2002/0090758 | A1 | 7/2002 | Henley et al. |
| 2004/0005740 | A1 | 1/2004 | Lochtefeld et al. |
| 2004/0031979 | A1 | 2/2004 | Lochtefeld et al. |
| 2004/0108537 | A1 | 6/2004 | Tiwari |
| 2005/0153524 | A1 | 7/2005 | Maa et al. |
| 2006/0030124 | A1 | 2/2006 | Maa et al. |
| 2006/0033110 | A1 | 2/2006 | Alam et al. |
| 2006/0226482 | A1 | 10/2006 | Suvorov |
| 2007/0032040 | A1 | 2/2007 | Lederer |
| 2007/0054466 | A1 | 3/2007 | Hebras |
| 2009/0004833 | A1 | 1/2009 | Suzuki et al. |
| 2009/0014828 | A1 | 1/2009 | Mizushima et al. |
| 2009/0087631 | A1 | 4/2009 | Schulze et al. |
| 2009/0092810 | A1 | 4/2009 | Lee et al. |
| 2009/0197396 | A1 | 8/2009 | Qu |
| 2009/0321829 | A1 | 12/2009 | Nguyen et al. |
| 2010/0105191 | A1* | 4/2010 | Hayamizu ............... C30B 15/00 438/476 |
| 2011/0174362 | A1 | 7/2011 | Tanner et al. |
| 2011/0298083 | A1 | 12/2011 | Yoneda |
| 2012/0016310 | A1 | 1/2012 | Holliday et al. |
| 2012/0091587 | A1 | 4/2012 | Or-Bach et al. |
| 2012/0238070 | A1 | 9/2012 | Libbert et al. |
| 2012/0267681 | A1 | 10/2012 | Nemoto et al. |
| 2013/0093060 | A1 | 4/2013 | Oka et al. |
| 2013/0120951 | A1 | 5/2013 | Zuo et al. |
| 2013/0122672 | A1 | 5/2013 | Or-Bach et al. |
| 2013/0168835 | A1 | 7/2013 | Botula et al. |
| 2013/0193445 | A1 | 8/2013 | Dennard et al. |
| 2013/0294038 | A1 | 11/2013 | Landru et al. |
| 2013/0344680 | A1 | 12/2013 | Arriagada et al. |
| 2014/0042598 | A1 | 2/2014 | Kitada et al. |
| 2014/0070215 | A1 | 3/2014 | Bedell et al. |
| 2014/0084290 | A1 | 3/2014 | Allibert et al. |
| 2014/0120654 | A1 | 5/2014 | Fujii et al. |
| 2014/0124902 | A1 | 5/2014 | Botula et al. |
| 2014/0273405 | A1 | 9/2014 | Liu et al. |
| 2015/0004778 | A1 | 1/2015 | Botula et al. |
| 2015/0115480 | A1 | 4/2015 | Peidous et al. |

FOREIGN PATENT DOCUMENTS

| | | | |
|---|---|---|---|
| EP | 2426701 | A1 | 7/2012 |
| JP | 2009177194 | A | 8/2009 |
| JP | 2012253364 | A | 12/2012 |
| WO | 2009120407 | A2 | 10/2009 |
| WO | 2012127006 | A1 | 9/2012 |

OTHER PUBLICATIONS

Lederer, D. et al., Enhanced High resistivity SOI wafers for RF Applications, 2004, IEEE International SOI Conference, Oct. 2004, pp. 46-47.

Lederer D. et al., New Substrate Passivation Method Dedicated to HR SOI Wafer Fabrication With Increased Substrate Resistivity, IEEE Electron Device Letters, Nov. 2005, pp. 805-807, vol. 26, No. 11.

Lederer, D. et al., Performance of SOI devices transferred onto passivated HR SOI substrates using a layer transfer technique, 2006, IEEE International SOI Conference Proceedings, 2006, pp. 29-30.

Kerr, Daniel C., Identification of RF harmonic distortion of Si substrates and its reduction using a trap-rich layer, IEEE (IEEE Topical Meeting), 2008, pp. 151-154.

Blicher, Adolph, Field-Effect and Bipolar Power Transistor Physics, Book, 1981, pp. 61-64, Academic Press, Inc.

Morkc, Hadis, Nanoheteroepitaxy and nano-ELO; Handbook of Nitride Semiconductors and Devices, Materials Properties, Physics, and Growth, 2009, Wiley, pp. 564-569, vol. 1, Chapter 3.5.5.3.

Zamir, S. et al., Reduction of cracks in GaN films on Si-on-insulator by lateral confined epitaxy, Journal of Crystal Growth, Elsevier Amsterdam, NL, Sep. 2002, pp. 375-380, vol. 243, No. 3-4.

Gao, Min, et al., A transmission electron microscopy study of microstructural defects in proton implanted silicon, Journal of Applied Physics, Oct. 15, 1996 American Institute of Physcis, pp. 4767-4769, vol. 70, No. 8.

Gao, Min, et al., Two-dimensional network of dislocations and nanocavities in hydrogen-implanted and two-step annealed silicon, Applied Physcis Letters, American Institute of Physics May 18, 1998, pp. 2544-2546vol. 72, No. 20.

International Search Report and Written Opinion from PCT/US2017/066063, dated Apr. 6, 2018 (10 pages).

* cited by examiner

METHOD OF TREATING SILICON WAFERS TO HAVE INTRINSIC GETTERING AND GATE OXIDE INTEGRITY YIELD

CROSS REFERENCE TO RELATED APPLICATION(S)

This application claims priority to U.S. provisional application Ser. No. 62/439,621, which was filed Dec. 28, 2016, the disclosure of which is hereby incorporated by reference as if set forth in its entirety.

FIELD OF THE INVENTION

The field of the invention relates generally to the preparation of a silicon wafer used in the manufacture of electronic components. More specifically, the invention relates to an anneal process which results in a silicon wafer having intrinsic gettering and gate oxide integrity yield.

BACKGROUND OF THE INVENTION

Single crystal silicon, which is the starting material for most processes for the fabrication of semiconductor electronic components, is commonly prepared with the so-called Czochralski (Cz) process wherein a single seed crystal is immersed into molten silicon and then grown by slow extraction. Molten silicon is contaminated with various impurities, among which is mainly oxygen, during the time it is contained in a quartz crucible. At the temperature of the silicon molten mass, oxygen comes into the crystal lattice until it reaches a concentration determined by the solubility of oxygen in silicon at the temperature of the molten mass and by the actual segregation coefficient of oxygen in the solidified silicon. Such concentrations are greater than the solubility of oxygen in solid silicon at temperatures typical for the processes used to fabricate electronic devices. As the crystal grows from the molten mass and cools, therefore, the solubility of oxygen in it decreases rapidly, whereby in the wafers sliced from the crystal, oxygen is present in supersaturated concentrations.

Thermal treatment cycles typically employed in the fabrication of electronic devices can cause the precipitation of oxygen in silicon wafers which are supersaturated in oxygen. Depending upon their location in the wafer, the precipitates can be harmful or beneficial. Oxygen precipitates located in the active device region of the wafer can impair the operation of the device. Oxygen precipitates located in the bulk of the wafer, however, are capable of trapping undesired metal impurities that may come into contact with the wafer. The use of oxygen precipitates located in the bulk of the wafer to trap metals is commonly referred to as internal or intrinsic gettering ("IG").

Thermal treatment cycles suitable for achieving internal gettering in a single crystal silicon wafer include rapid thermal anneal (e.g., the Magic Denuded Zone® process by SunEdison Semiconductor, Ltd.) or a long duration anneal in an inert gas ambient atmosphere, such as argon. The short annealing duration in a rapid thermal anneal process is a cost effective solution. However, the precipitate free zone (PFZ, also referred to as denuded zone) depth is typically too deep to getter metallic impurities effectively in the top 100 micrometers of silicon (i.e., the typical amount of silicon left over after back grinding). Conversely, the long duration anneal can achieve both a good PFZ zone (tunable within the top 20 micrometers) and gettering capability. However, the long duration anneal requires annealing time (several hours), which impacts manufacturing cost and output.

Rapid thermal anneal in a nitrogen containing gas ambient atmosphere was developed as an alternative to the Magic Denuded Zone® process and long duration anneal. Rapid thermal anneal in a nitriding ambient atmosphere, e.g., $NH_3$ or $N_2$ gas, achieves strong internal gettering capability with shallow PFZ (Precipitate Free Zone, or Denuded Zone). See, e.g., J Appl Phys, 114, 043520 (2013). It has been previously unrecognized in the art that rapid thermal anneal in a nitrogen gas containing ambient atmosphere may degrade gate oxide integrity yield (GOI).

BRIEF DESCRIPTION OF THE INVENTION

Briefly, the present invention is directed to a method to achieve suitable GOI yield in a single crystal silicon wafer previously subjected to rapid thermal anneal in a nitrogen gas containing ambient atmosphere.

In one aspect, the present invention is directed to a method of treating a single crystal silicon wafer, the method comprising: heat treating the single crystal silicon wafer in a first ambient atmosphere comprising a nitrogen-containing gas at a temperature of at least about 1100° C. to increase a density of crystal lattice vacancies in a bulk region of the single crystal silicon wafer and to form a silicon nitride layer on a front surface of the single crystal silicon wafer, wherein the single crystal silicon wafer comprises two major, parallel surfaces, one of which is the front surface and one of which is a back surface, a central plane between the front surface and the back surface, a circumferential edge joining the front surface and the back surface, a front surface layer having a depth, D, measured from the front surface and toward the central plane, and wherein the bulk region is between the front surface layer and the central plane; removing the silicon nitride layer from the front surface of the single crystal silicon wafer; heat treating the single crystal silicon wafer in a second ambient atmosphere comprising oxygen and a temperature between about 900° C. and about 1100° C. for a duration greater than 30 minutes to form a silicon oxide layer on the front surface of the single crystal silicon wafer having a minimum thickness of at least about 50 Ångströms; and removing the silicon oxide layer from the front surface of the single crystal silicon wafer.

In another aspect, the invention is directed to a single crystal silicon wafer comprising two major, parallel surfaces, one of which is a front surface and one of which is a back surface, a central plane between the front surface and the back surface, a circumferential edge joining the front surface and the back surface, a front surface layer having a depth, D, measured from the front surface and toward the central plane, and a bulk region is between the front surface layer and the central plane, wherein: the bulk region comprises oxygen precipitates at a density of at least about $1 \times 10^7$ $cm^{-3}$ and a peak density of oxygen precipitates of at least about $1 \times 10^9$ $cm^{-3}$, wherein the peak density is between the front surface layer and the central plane; the front surface layer comprises oxygen precipitates at a density of less than about $1 \times 10^7$ $cm^{-3}$, wherein the depth, D, of the front surface layer is between about 1 micrometers and about 40 micrometers; and the front surface has no gate oxide integrity pattern related crystal defect bands.

DETAILED DESCRIPTION OF THE EMBODIMENT(S) OF THE INVENTION

The present invention is directed to a method to recover the gate oxide integrity (GOI) yield of a single crystal silicon wafer, e.g., a perfect silicon wafer, after a rapid thermal anneal treatment in a nitriding atmosphere. In some embodiments, the present invention is directed to a method to recover the gate oxide integrity (GOI) yield of a single crystal silicon wafer, e.g., a perfect silicon wafer, after a rapid thermal anneal treatment in a nitrogen gas-containing ambient atmosphere, e.g., NH$_3$, nitrogen, or a combination thereof. In general, rapid thermal anneal in a nitrogen gas-containing ambient atmosphere, e.g., NH$_3$, nitrogen, or a combination thereof, followed by an anneal sufficient to grow bulk microdefects in the bulk of the wafer is sufficient to obtain a single crystal silicon wafer comprising a precipitate free zone (PFZ, or denuded zone) in a surface region. However, BMD in the bulk of the wafer may degrade the GOI yield of the silicon wafer by exposing as-grown crystal defects (e.g., oxygen precipitates) on the wafer surface to vacancies generated by the silicon nitride film. These vacancies may grow and stabilize oxygen precipitates on the wafer surface, and these defects may contribute to the degradation of the gate oxide integrity yield. Since the process window for GOI from the precipitate free zone formed by rapid thermal anneal is extremely narrow, it is necessary to find a method by which to recover the full process window for GOI after rapid thermal anneal without any degradation of BMD peak density and shallow PFZ depth.

Figure 1:
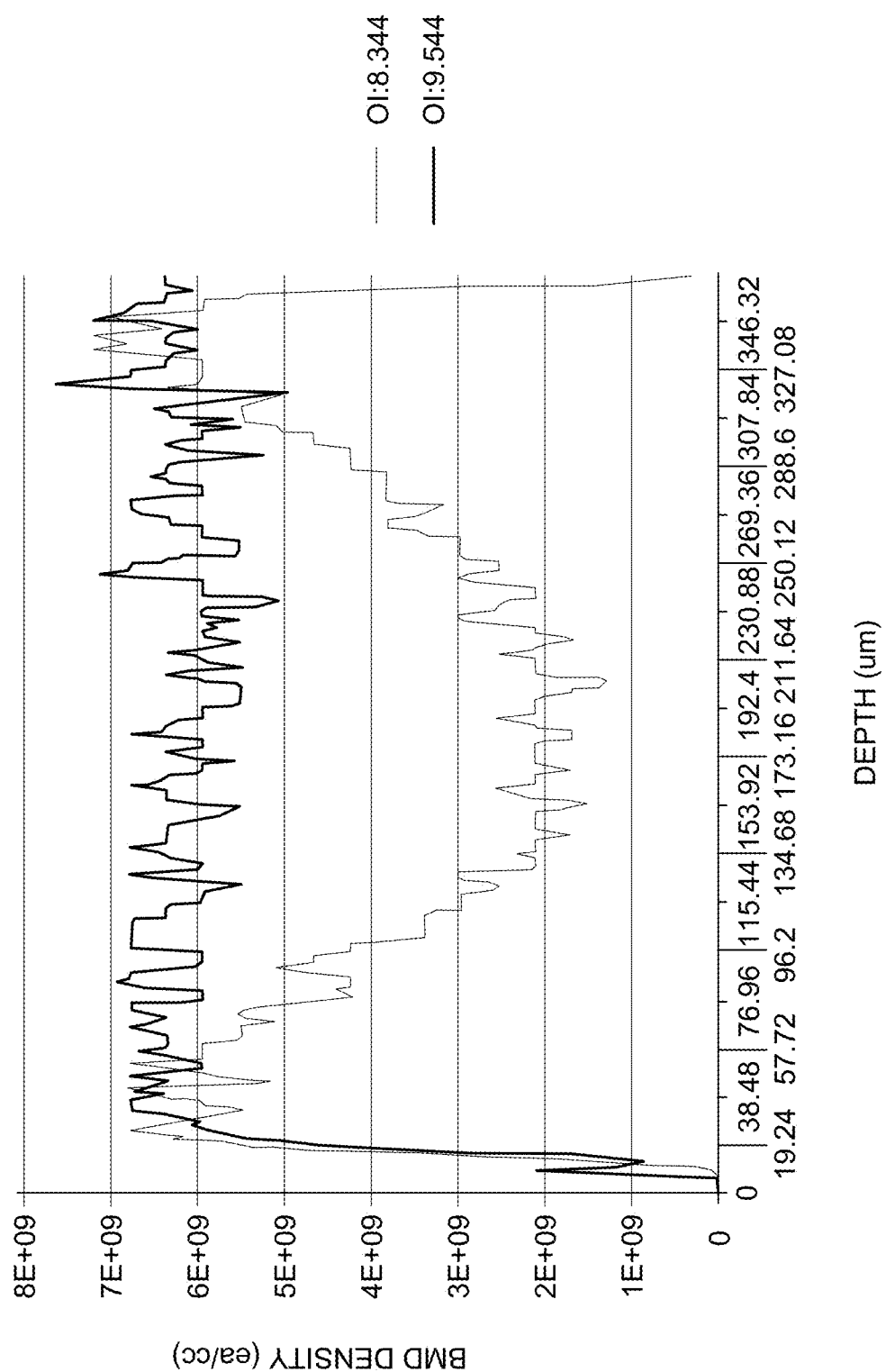
FIG. 1 depicts typical depth profiles of bulk microdefect density in wafers subjected to rapid thermal anneal in an environment comprising ammonia, followed by NEC1 treatment (4 hours at 800° C., followed by 16 hours at 1000° C.).

Rapid thermal anneal in a nitrogen gas-containing ambient atmosphere advantageously yields a shallow precipitate free zone. See FIG. 1, depicting typical depth profiles of bulk microdefect density in wafers subjected to rapid thermal anneal in an ammonia environment, followed by NEC1 treatment (4 hours at 800° C. followed by 16 hours at 1000° C.). The wafers have interstitial oxygen concentrations as shown in FIG. 1 of 8.344 PPMA and 9.544 PPMA. A very shallow PFZ, such as less than about 40 micrometers, less than about 30 micrometers, less than about 20 micrometers, or even less than about 10 micrometers, may be formed at both front and back surfaces of wafers. Moreover, the peak density of BMD is formed nearby wafer surface, which is generated during the heat treatment designed to grow oxygen precipitates. Since the peak BMD density is on the order of between 6 and 8×10$^9$ precipitates per cubic centimeter, regardless of key parameters such as wafer oxygen content, soak temperature of MDZ, and cooling rate, this peak BMD density is the within the preferred range for embodiments of the present invention. In some preferred embodiments, rapid thermal anneal in a nitriding ambient atmosphere yields a silicon wafer having a shallow PFZ depth of less than 10 micrometers and high BMD peak at between 20 and 30 micrometers depth, or even between 10 and 20 micrometers depth. Such a wafer provides much stronger gettering capability than rapid thermal anneal in an oxygen gas containing ambient atmosphere, which has a deeper PFZ depth with BMD density peak nearby wafer depth center.

Rapid thermal anneal in a nitrogen gas-containing ambient may cause gate oxide integrity degradation. A GOI failure pattern (see FIGS. 2A, 2B, 5, and 7) is related to crystal defect bands. Defect bands include crystal originated pits (COP, a void defect), H-band, P-band, L-band, Perfect Silicon Interstitial dominant band, B-defect band, and A-defect band. Typically, GOI degradation takes place if a wafer has any of COP, H-band, and P-band defects. These crystal defect bands are either core or ring pattern, and the defect bands are observed in various radial positions in a wafer. If GOI pattern is not core or ring pattern, this asymmetric pattern would be caused by not crystal defects but wafer processing or GOI test preparation. GOI breakdown voltage (MV/cm) is also affected by crystal defect band and defect type. In general, gate oxide integrity degradation may occur in the range of between 5 and 9 MV/cm due to crystal originated pits and H-band defects, which affects the uniformity of the gate oxide thickness. In general, gate oxide integrity degradation may occur in the range of between 10 to 12 mV/cm caused by P-band defects, micro-void defect, or oxygen precipitate, which is formed by combination of injected vacancy from Si$_3$N$_4$/Si interface during rapid thermal anneal and by grown-in oxygen precipitate from crystal or large size grown-in oxygen precipitate. Since oxidation affects high stress field GOI, the grown-in oxygen precipitate is supposed as major source of GOI degradation. Both the GOI failure pattern shape and the breakdown voltage are reviewed to understand if GOI failure was caused by crystal defect bands. If GOI failure pattern does match with crystal defect bands or breakdown voltage, it is supposed the GOI failure pattern is related to the crystal defect bands.

The density of defects is not significantly changed by rapid thermal anneal in a nitrogen containing environment. However, rapid thermal anneal in a nitrogen environment may decorate defects with injected vacancies. Accordingly, a small size defect could be dissolved by the RTA effect, but other defects are decorated by vacancies thereby rendering them larger and more stable. This affects gate oxide uniformity and degrades GOI yield. Larger defects, that can be detected, may be on the order of 20 nanometers or greater, and the density of such defects may be on the order of $1 \times 10^8$ ea/cm$^3$. Such a density is sufficient to degrade the GOI on the order stated above. The actual density of defect is much higher, if small size but undetectable defects (<20 nm) are included. The large size, high density of defects affects the uniformity of gate oxide, and non-uniform gate oxide has the local weakening against electric stress field due to stress concentration related with non-uniform oxide thickness. Gate oxide breakdown may take place, if the supply of vacancies, which may be encouraged by RTA in a nitrogen environment, enlarges and stabilizes oxygen precipitates.

Figure 2B:
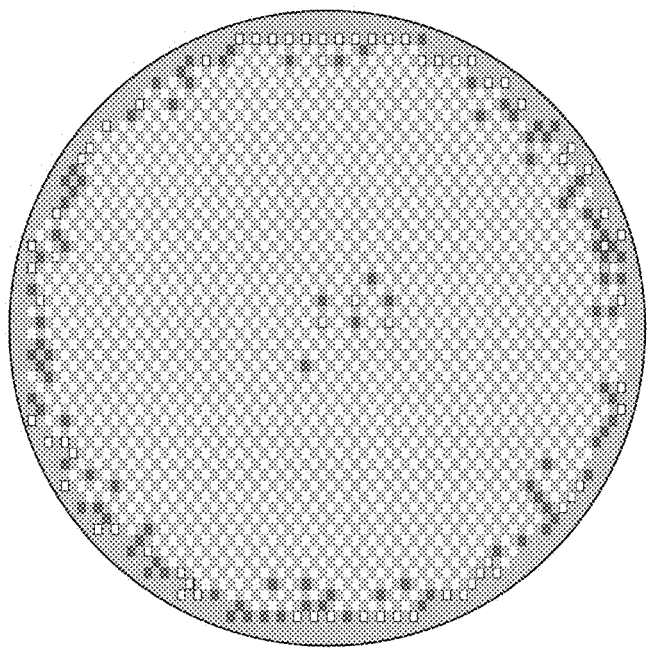
FIGS. 2A and 2B illustrates GOI yield in a single crystal silicon wafer prior to rapid thermal anneal (wafer on the left side in FIG. 2A) and after rapid thermal anneal in an environment comprising ammonia (wafer on the right side in FIG. 2B).
Figure 2A:
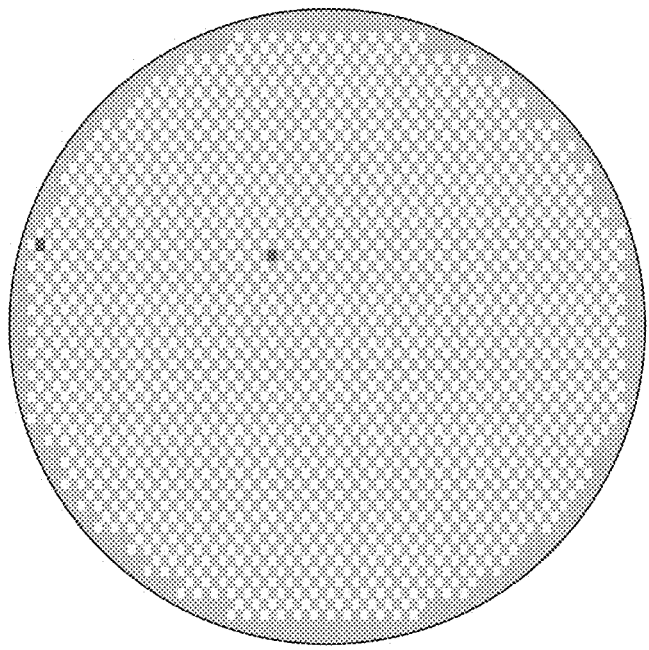

See FIGS. 2A and 2B, which illustrates GOI yield in a single crystal silicon wafer prior to rapid thermal anneal (wafer on the left side in FIG. 2A) and after rapid thermal anneal in an environment comprising ammonia (wafer on the right side in FIG. 2B). It is apparent that the rapid thermal anneal in ammonia degrades the GOI yield in the wafer via the gate oxide integrity pattern related crystal defect bands present at or near the wafer's circumferential edge.

The present invention is therefore directed to a method of preparing single crystal silicon wafers in which the wafers are subjected to rapid thermal anneal in a nitrogen gas-containing ambient atmosphere to thereby yield wafers having a thin precipitate free zone and a peak density or concentration of oxygen precipitates near the wafer surface. After formation of the oxygen precipitate nuclei template, the silicon nitride layer is stripped, and the wafers are subjected to an oxidative anneal sufficient to form a silicon oxide layer on the wafer surface. The wafer is thereafter stripped of the silicon oxide layer, which removes surface defects that degrade GOI yield. The wafers prepared according to the method of the present invention have an ideal oxygen precipitate nuclei template and additionally lack surface defects that degrade the GOI yield. Specifically, the wafers lack a gate oxide integrity pattern related crystal defect bands of the type exemplified in FIG. 2B. Thereafter, the wafers may be subjected to an anneal, such as NEC1, sufficient to grow oxygen precipitates in the bulk region of the wafer. Advantageously, since the wafers were subjected to RTA in a nitriding ambient atmosphere, the peak density of the oxygen precipitates in the wafer may be within about 40 micrometers of the wafer surface, such as within about 30 micrometers of the wafer surface, or between about 10 micrometers and about 20 micrometers from the wafer surface.

I. Substrates

Figure 3A:
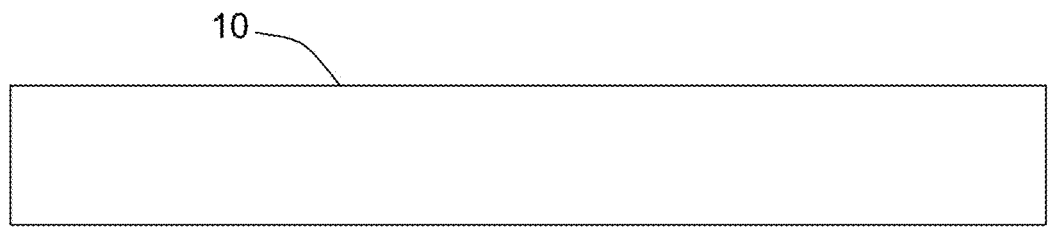
FIGS. 3A through 3D depict a process flow according to some embodiments of the present invention.
Figure 3B:
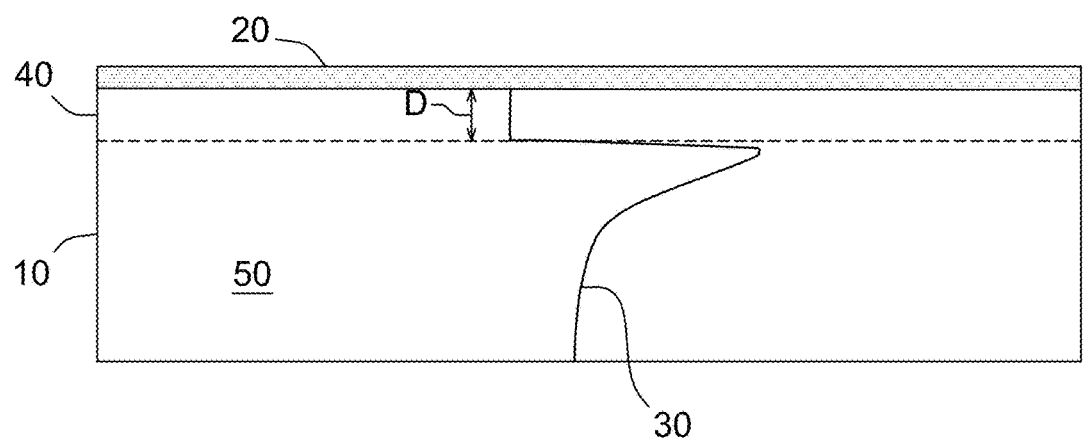

With reference now to FIG. 3A, a silicon wafer 10, or portion thereof, is depicted. A silicon wafer 10 may comprise two major, generally parallel surfaces, one of which is a front surface of the substrate and the other of which is a back surface of the substrate. A circumferential edge joins the front and back surfaces, and a central plane lies between the front and back surfaces. With reference to FIG. 3B, the silicon wafer 10 comprises a front surface layer 40 having a depth, D, and a bulk region or layer 50 between the front surface layer and the central plane. Prior to any operation as described herein, the front surface and the back surface of the silicon wafer 10 may be substantially identical. A surface is referred to as a "front surface" or a "back surface" merely for convenience and generally to distinguish the surface upon which the operations of method of the present invention are performed. In some embodiments of the present invention, the operations of the invention are performed on the front surface of the silicon wafer 10. In some embodiments of the present invention, the operations of the present invention are performed on both the front surface and the back surface of the silicon wafer 10. In addition, because silicon wafers typically have some total thickness variation (TTV), warp, and bow, the midpoint between every point on the front surface and every point on the back surface may not precisely fall within a plane. As a practical matter, however, the TTV, warp, and bow are typically so slight that to a close approximation the midpoints can be said to fall within an imaginary central plane which is approximately equidistant between the front and back surfaces.

In general, the silicon wafer 10 has a diameter of at least about 20 mm, more typically between about 20 mm and about 500 mm. In some embodiments, the diameter is at least about 20 mm, at least about 45 mm, at least about 90 mm, at least about 100 mm, at least about 150 mm, at least about 200 mm, at least about 250 mm, at least about 300 mm, at least about 350 mm, or even at least about 450 mm. The silicon wafer 10 may have a thickness between about 100 micrometers and about 5000 micrometers, such as between about 100 micrometers and about 1500 micrometers, suitably within the range of about 500 micrometers to about 1000 micrometers.

In particularly preferred embodiments, the silicon wafer 10 comprises a wafer sliced from a single crystal silicon wafer which has been sliced from a single crystal ingot grown in accordance with conventional Czochralski crystal growing methods. Such methods, as well as standard silicon slicing, lapping, etching, and polishing techniques are disclosed, for example, in F. Shimura, *Semiconductor Silicon Crystal Technology*, Academic Press, 1989, and *Silicon Chemical Etching*, (J. Grabmaier ed.) Springer-Verlag, N.Y., 1982 (incorporated herein by reference). Preferably, the wafers are polished and cleaned by standard methods known to those skilled in the art. See, for example, W. C. O'Mara et al., *Handbook of Semiconductor Silicon Technology*, Noyes Publications. If desired, the wafers can be cleaned, for example, in a standard SC1/SC2 solution. In some embodiments, the single crystal silicon wafers of the present invention are single crystal silicon wafers which have been sliced from a single crystal ingot grown in accordance with conventional Czochralski ("Cz") crystal growing methods, typically having a nominal diameter of at least about 150 mm, at least about 200 mm, at least about 300 mm, or at least about 450 mm. Preferably, both the single crystal silicon handle wafer and the single crystal silicon donor wafer have mirror-polished front surface finishes that are free from surface defects, such as scratches, large particles, etc. Wafer thickness may vary from about 250 micrometers to about 1500 micrometers, such as between about 300 micrometers and about 1000 micrometers, suitably within the range of about 500 micrometers to about 1000 micrometers. In some specific embodiments, the wafer thickness may be between about 725 micrometers and about 800 micrometers, such as between about 750 micrometers and about 800 micrometers. In some embodiments, the wafer thickness may be about 725 micrometers. In some embodiments, the wafer thickness may be about 775 micrometers.

In some preferred embodiments, the silicon wafer 10 is a polished silicon wafer grown by the CZ method. The silicon wafer 10 may have any crystal orientation, e.g., (100), (110), and (111), and the choice of crystal orientation may be dictated by the end use of the structure.

In general, the starting silicon wafer 10 may have an oxygen concentration falling anywhere within the range attainable by the CZ process, which is typically between about $2 \times 10^{17}$ and about $9 \times 10^{17}$ atoms/cm$^3$ or about 4 to about 18 PPMA, as determined in accordance with ASTM calibration; $O_i=4.9\alpha$, where a is the absorption coefficient of the 1107 cm$^{-1}$ absorption band; new ASTM standard F-121-83). In some preferred embodiments, the silicon wafer 10 has an interstitial oxygen concentration of less than about $6 \times 10^{17}$ atoms/cm$^3$, or about 12 PPMA, such as between about $2 \times 10^{17}$ and about $5 \times 10^{17}$ atoms/cm$^3$ or about 4 to about 10 PPMA. In addition, the starting silicon wafer 10 preferably has an absence of stabilized oxygen precipitates (i.e., oxygen precipitates which cannot be dissolved or annealed out of the wafer at a temperature of about 1200° C. or less) in the near-surface region of the wafer.

Substitutional carbon, when present as an impurity in single crystal silicon, has the ability to catalyze the formation of oxygen precipitate nucleation centers. For this and other reasons, therefore, it is preferred that the single crystal silicon wafer 10 have a low concentration of carbon. That is, the single crystal silicon wafer 10 preferably has a concentration of carbon which is less than about $5 \times 10^{16}$ atoms/cm$^3$, preferably which is less than $1 \times 10^{16}$ atoms/cm$^3$, and more preferably less than $5 \times 10^{15}$ atoms/cm$^3$.

Silicon wafer resistivity is not critical to the method of the present invention. However, resistivity may vary depending upon end use requirements. In view thereof, the silicon wafer 10 may be heavily doped, may be semi-insulating, or may have a doping profile somewhere between. The resistivity may therefore vary from milliohm or less to megaohm or more. In some embodiments, the silicon wafer 10 comprises a p-type or an n-type dopant. Suitable dopants include boron (p type), gallium (p type), phosphorus (n type), antimony (n type), and arsenic (n type). The dopant concentration is selected based on the desired resistivity of the wafer. In some embodiments, the wafer types may have resistivity so that they can be characterized as any of N++ type, N+ type, N type, N− type, and N−− type. Typical N+ resistivity ranges are as low as 10 milliohm-cm for Sb doping, N++ as low as 2 milliohm-cm for As doping, and N+++ as low as 1 milliohm-cm for P doping. Specification ranges are usually 2-3X for max/min due to segregation in crystal growth. In some embodiments, the wafer types may have resistivity so that they can be characterized as any of P++ type, P+ type, P type, P− type, and P−− type. Typical P+ resistivity range is as low as 10 milliohm-cm and P++ as low as 5 milliohm-cm. Specification ranges are usually 1.5-2X for max/min due to segregation in crystal growth. The resistivity of the wafer may therefore vary from about 0.1 milliohm-cm to about 10 kiloohm-cm, such as between about 0.01 ohm-cm to about 10 kiloohm-cm. In some embodiments, the resistivity may range from about 0.1 milliohm-cm to about 1 kiloohm-cm, such as from 0.1 milliohm-cm to about 100 ohm-cm, such as from 0.1 milliohm-cm to about 10 ohm-cm, or from about 0.1 milliohm-cm to about 1 ohm-cm. In some embodiments, the resistivity may range from about 0.01 ohm-cm to about 1 kiloohm-cm, such as from 0.01 ohm-cm to about 100 ohm-cm, such as from 0.01 ohm-cm to about 10 ohm-cm, or from about 0.01 ohm-cm to about 1 ohm-cm. Substrate are also available in lightly doped form, such as nominal values of 1 ohm-cm or 10 ohm-cm or 100 ohm-cm, in both N-type (Phos) and P-type (Boron). Choice of substrate resistivity depends on application (example if substrate is used as backgate then lower resistivity is preferred).

In some embodiments, the silicon wafer 10 is cleaned prior to rapid thermal anneal, for example to remove organic matter or other impurities. A suitable cleaning solution is the piranha solution, which comprises $H_2SO_4$ (concentrated) and $H_2O_2$ (30% solution), typically in a 3:1 ratio, but other ratios, such as 4:1 or 7:1 are suitable. Cleaning duration is suitably between about 15 minutes and about 2 hours.

II. Rapid Thermal Anneal

According to the method of the present invention, a rapid thermal treatment is carried out to form a distribution of oxygen precipitate nuclei which establish a profile or template for oxygen precipitation in the wafer. In one or more embodiments, the template is for a wafer having oxygen precipitates in the wafer bulk but a low density of, and preferably an essential absence of, oxygen precipitates in a near-surface region which may be referred to herein as a precipitate free zone or a "denuded zone." Advantageously, denuded zones of any desired depth may be obtained. In some embodiments, denuded zone depths may be at least about 1 micrometer, at least about 3 micrometers, or at least about 5 micrometers, as measured from the front surface of the wafer and toward the central plane. In some embodiments, denuded zone depths may be less than about 40 micrometers, as measured from the front surface of the wafer and toward the central plane, such as less than about 30 micrometers, or less than 20 micrometers, less than 15 micrometers, or even less than 10 micrometers, measured from the front surface of the wafer and toward the central plane. Moreover, the template is such that the peak density of oxygen precipitates (resulting from a later anneal sufficient to form oxygen precipitates) may occur within about 40 micrometers of the wafer surface, such as within about 30 micrometers of the wafer surface, or between about 10 micrometers and about 20 micrometers from the wafer surface.

In this regard, the oxygen precipitate nuclei that form generally contain crystal lattice vacancies as a part of the nuclei. The vacancies may be associated (i.e., bonded and/or grouped with) oxygen such as an oxygen dimer ($O_2$); however, it should be understood that the present disclosure is not limited to any structural and/or morphological-specific oxygen precipitate nuclei. For example, the oxygen precipitate nuclei may be a vacancy alone or may be bound as VO. As used herein, "oxygen precipitate nuclei" refers to any structural unit which forms oxygen precipitates upon an oxygen precipitation heat treatment or forms such precipitates after being activated and "oxygen precipitate nuclei" as used herein should not be considered in a limiting sense.

The use of a rapid thermal process to form a distribution of oxygen precipitate nuclei which, in turn, establish a template for oxygen precipitation, is generally described in U.S. Pat. Nos. 5,994,761; 6,191,010 and 6,180,220, each of which is incorporated herein by reference for all relevant and consistent purposes. The "ideal precipitating process" described therein typically yields a non-uniform distribution of oxygen precipitate nuclei, with the concentration in the wafer bulk being higher than in a surface layer. Upon a subsequent oxygen precipitation heat treatment, the high concentration of nuclei in the wafer bulk form oxygen precipitate nucleation centers which aid in the formation and growth of oxygen precipitates, the concentration of nuclei in the near-surface region being insufficient to do so. As a result, a denuded zone forms in the near-surface region and oxygen precipitates, sometimes referred to as bulk micro-defects, form in the wafer bulk. As described therein, denuded zones depths may be less than about 40 micrometers, as measured from the front surface of the wafer and toward the central plane, such as less than about 30 micrometers, or less than 20 micrometers, less than 15 micrometers, or even less than 10 micrometers, measured from the front surface of the wafer and toward the central plane. Denuded zone depths may be at least about 1 micrometer, at least about 3 micrometers, or at least about 5 micrometers, as measured from the front surface of the wafer and toward the central plane. Additionally, the peak density of oxygen precipitates (resulting from a later anneal sufficient to form oxygen precipitates) may occur within about 40 micrometers of the wafer surface, such as within about 30 micrometers of the wafer surface, or between about 10 micrometers and about 20 micrometers from the wafer surface.

The process for forming a non-uniform distribution of vacancy-containing oxygen precipitate nuclei, the silicon wafer 10 is subjected to a heat-treatment step in which the wafer is heated to an elevated temperature to form and thereby increase the number density of oxygen precipitate nuclei containing vacancies in silicon wafer 10. Preferably, this heat-treatment step is carried out in a rapid thermal annealer in which the wafer is rapidly heated to a target temperature and annealed at that temperature for a relatively short period of time. Temperatures of at least about 1100° C., at least about 1175° C., at least about 1200° C. or at least about 1300° C. (e.g., from about 1100° C. to about 1400° C., from about 1100° C. to about 1300° C., or from about 1100° C. to about 1200° C.) may be used. The silicon wafer 10 will generally be maintained within these temperature ranges for at least about 1 second and typically for at least several seconds (e.g., at least about 3 seconds or at least about 5 seconds or more) or even several tens of seconds (e.g., at least about 20 seconds, at least about 30 seconds, at least about 40 seconds, at least about 60 seconds, at least about 120 seconds or more). In some embodiments, the silicon wafer 10 is subjected to a rapid thermal anneal at two different temperatures. For example, in some embodiments, the silicon wafer 10 is subjected to anneal at a temperature of between about 1100° C. and about 1200° C. for a duration between about 1 second and about 60 seconds, and then subjected to anneal at a temperature of between about 1200° C. and about 1300° C. for a duration between about 1 second and about 60 seconds. In some embodiments, the wafer may be annealed at a temperature of about 1100° C. for between 1 to 10 seconds, such as about 1 second, followed by anneal at a temperature of about 1215° C. for a period between about 5 seconds and about 20 seconds, such as about 10 seconds. Depending upon the desired characteristics of the wafer and the atmosphere in which the wafer is being annealed, for a period which may range up to about 60 seconds which is near the limit for commercially available rapid thermal annealers. Maintaining the silicon wafer 10 at an established temperature during the anneal for additional time does not appear, based upon experimental evidence obtained to-date, to lead to an increase in vacancy concentration.

Figure 3C:
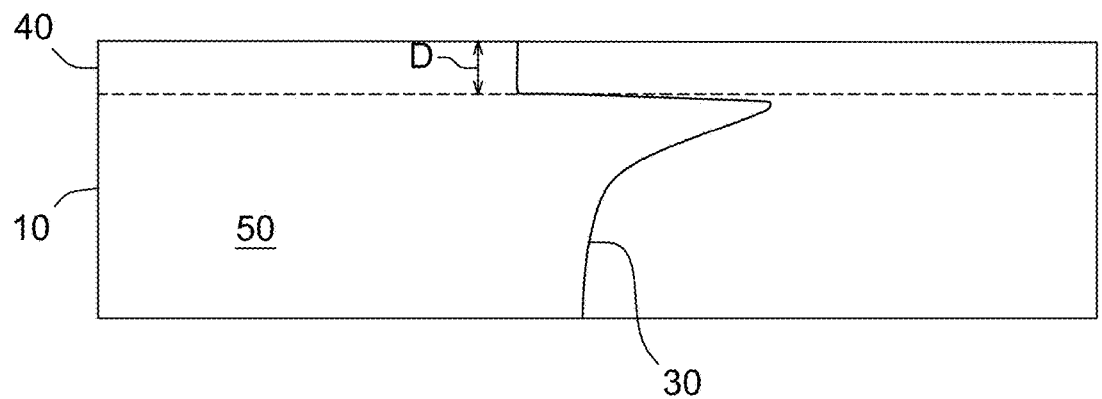

With reference to FIGS. 3B and 3C, after the rapid thermal annealing step, the silicon wafer 10 has a front surface layer 40 which comprises the region of the wafer between the front surface and a distance, D, measured from the front surface and toward the central plane, and a bulk region 50 which comprises a second region of the wafer between the central plane and the surface layer, wherein the surface layer and bulk region have a concentration of oxygen precipitate nuclei comprising crystal lattice vacancies. The denuded zone forms in the front surface layer 40, while oxygen precipitation according to the template 30 formed by the rapid thermal anneal occurs in the bulk region 50 during a heat treatment sufficient to precipitate oxygen precipitates. The depth, D, of the front surface layer 40 may be less than about 40 micrometers, as measured from the front surface of the wafer and toward the central plane, such as less than about 30 micrometers, or less than 20 micrometers, less than 15 micrometers, or even less than 10 micrometers, such as between about 5 micrometers and about 40 micrometers, or between about 5 micrometers and about 30 micrometers, or between about 5 micrometers and about 20 micrometers, or between about 5 micrometers and about 10 micrometers. The bulk region 50 may be considered the material between the front surface layer 40 and the central plane of the silicon wafer 10. In embodiments wherein the back surface is exposed to the nitriding atmosphere, a similar back surface layer and bulk region are formed in the back of the wafer.

According to the method of the present invention, the rapid thermal annealing step is carried out in the presence of a nitrogen containing gas, i.e., a nitriding atmosphere. In some embodiments, the rapid thermal annealing step is carried out in an atmosphere containing nitrogen gas ($N_2$) or a nitrogen-containing compound gas such as ammonia, or a combination of such gases. In some embodiments, the ambient atmosphere may additionally comprise an inert gas, such as argon. In general, annealing the wafer in a rapid thermal annealer in the presence of a nitriding atmosphere produces a non-uniform oxygen precipitate nuclei concentration (number density) profile in the wafer with the peak concentration occurring within about 100 micrometers of the surface, or within about 40 micrometers of the surface, such as from about 10 to about 100 micrometers of the surface, such as between about 10 to about 50 micrometers, or between about 10 to about 40 micrometers, or between about 10 to about 30 micrometers, or between about 10 to about 20 micrometers, which is exposed to the nitriding gas and a lesser and relatively uniform concentration in the wafer bulk. If the front and back surfaces of the wafer are exposed to the nitriding atmosphere during the rapid thermal annealing step, therefore, the resulting wafer will have an oxygen precipitate nuclei concentration (number density) profile which is generally "M-shaped" or "U-shaped" for a cross-section of the wafer, that is, a maximum concentration will occur within several micrometers of each of the front and back surfaces and a relatively constant and lesser concentration will occur throughout the wafer bulk. See FIG. 3B, depicting an oxygen precipitate nuclei concentration profile or template 30 in which the peak oxygen precipitate nuclei concentration is near the front surface of the silicon wafer 10. Although not shown, an oxygen precipitate nuclei concentration template similar to template 30 would occur near the back surface of the silicon wafer 10 as well. Accordingly, silicon wafer 10 would comprise two peaks of oxygen precipitate nuclei concentration, with one peak near the front surface and the one peak near the back surface of the wafer 10.

Upon completion of the rapid thermal annealing step, the silicon wafer 10 is rapidly cooled through the range of temperatures at which vacancy-containing oxygen precipitate nuclei and, in particular, in which vacancies themselves are relatively mobile in the single crystal silicon. Vacancy-containing oxygen precipitate nuclei are typically mobile in silicon within a commercially practical period of time down to temperature in excess of about 700° C., in excess of about 800° C., in excess of about 900° C. or even in excess of about 1000° C. As the temperature of the wafer is decreased through this range of temperatures, the vacancy-containing nuclei diffuse to the surface of the wafer and/or the oxide layer on the wafer surface and become annihilated, thus leading to a change in the nuclei concentration profile with the extent of change depending upon the length of time the wafer is maintained at a temperature within this range. If the wafer was held at a temperature within this range for an infinite period of time, the nuclei concentration profile would once again become uniform but the equilibrium concentration would be less than the concentration immediately upon completion of the heat treatment step. However, as further described herein, by rapidly cooling the wafer, either alone or in conjunction with control of the ambient in which the wafer is heat-treated and cooled, a non-uniform distribution of oxygen precipitate nuclei can be achieved, the concentration in the wafer bulk being greater than the concentration in a region near the surface. For example, process conditions (e.g., cooling rate) may be controlled, for example, such that the maximum nuclei concentration is a within about 100 micrometers of the surface, or within about 40 micrometers of the surface, such as from about 10 to about 100 micrometers of the surface, such as between about 10 to about 50 micrometers, or between about 10 to about 40 micrometers, or between about 10 to about 30 micrometers, or between about 10 to about 20 micrometers.

In this regard it is to be further noted that, in general, a "denuded zone" as used herein is a zone occupying the region near the surface of a wafer which has (i) an absence of oxygen precipitates, defined as less than about $10^7$ oxygen precipitates/cm$^3$, less than about $10^6$ oxygen precipitates/cm$^3$, or even less than about $10^5$ oxygen precipitates/cm$^3$ and (ii) a low concentration of, and preferably an essential absence of oxygen precipitate nuclei which, upon being subjected to an oxygen precipitation heat-treatment, are converted to oxygen precipitates.

Conveniently, the cooling step may be carried out in the same atmosphere in which the heating step is carried out. However, it may be carried out in a different atmosphere which may modify the shape of the nuclei concentration profile. Regardless of the selected atmosphere, the effect of rapidly cooling the wafer predominates atmospheric factors and results in a significant decrease in the concentration of vacancies in the near surface regions. The rapid thermal annealing step and cooling step may be carried out in, for example, any of a number of commercially available rapid thermal annealing ("RTA") furnaces in which wafers are individually heated by banks of high power lamps. RTA furnaces are capable of rapidly heating a silicon wafer, for example, from room temperature to about 1200° C. in a few seconds.

In general, the average cooling rate within the range of temperatures in which oxygen precipitate nuclei are mobile is at least about 5° C. per second or, as in other embodiments, at least about 20° C. per second, at least about 50° C. per second, at least about 100° C. per second or even at least about 150° C. per second or more (e.g., from about 20° C. per second to about 200° C. per second, from about 20° C. per second to about 100° C. per second or from about 100° C. per second to about 200° C. per second). Typically, current processing equipment results in a cooling rate between about 30° C. and about 80° C. per second and more typically between about 40° C. and about 50° C. per second. In this regard it is to be noted that, once the wafer is cooled to a temperature outside the range of temperatures at which vacancy-containing oxygen precipitate nuclei are relatively mobile in the single crystal silicon, the cooling rate does not appear to significantly influence the precipitating characteristics of the wafer and thus does not appear to be narrowly critical.

Rapid thermal anneal in a nitriding atmosphere forms a silicon nitride layer 20, see FIG. 3B, on the front surface layer of the silicon wafer 10. Since the RTA process occurs in a few seconds, the silicon nitride layer in general is relatively thin, such as at least about 5 Ångströms, such as between about 5 Ångströms and about 1000 Ångströms, or between about 5 Ångströms and about 500 Ångströms, or between about 5 Ångströms and about 200 Ångströms, or between about 5 Ångströms and about 100 Ångströms. Since the silicon nitride layer 20 interrupts the formation of oxide layer during subsequent oxidation cycle as well as vacancy injection and blocking of its out-diffusion, the nitride layer is removed. See FIG. 3C. In some embodiments, the silicon nitride layer is removed by polishing, wet chemical etching (e.g., KOH etching or phosphoric acid etching), or plasma etching. Techniques suitable for removing the silicon nitride layer are known in the art.

In some embodiments, the silicon nitride layer 20 is removed by touch polishing. Touch polishing is sufficient to remove the entire silicon nitride layer. Suitable polishing solutions for removal of the silicon nitride layer are known in the art.

In some embodiments, the silicon wafer 10 is cleaned after removal of the silicon nitride layer. A suitable cleaning solution is the piranha solution, which comprises $H_2SO_4$ (concentrated) and $H_2O_2$ (30% solution), typically in a 3:1 ratio, but other ratios, such as 4:1 or 7:1 are suitable. Cleaning duration is suitably between about 15 minutes and about 2 hours.

III. Oxidative Anneal

Figure 3D:
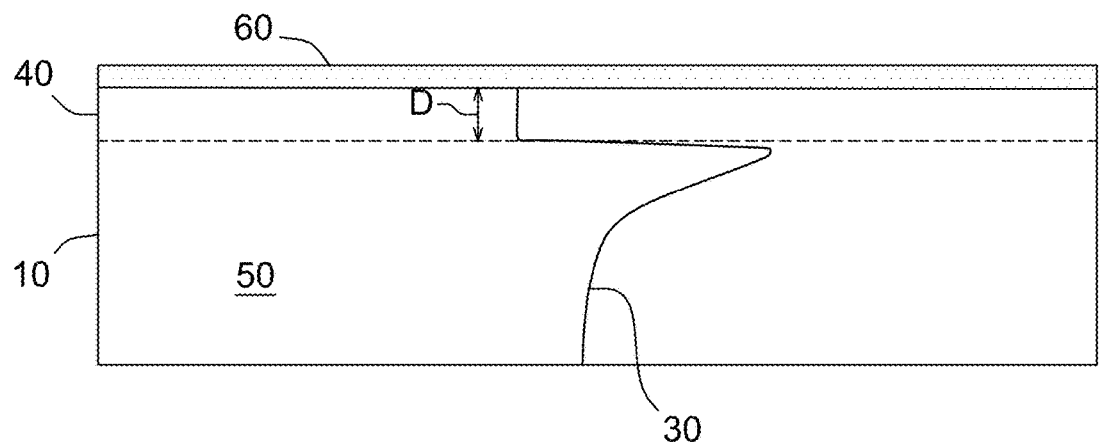

After the silicon nitride layer is stripped (see FIG. 3C), the silicon wafer 10 is subjected to an oxidative anneal for a duration and temperature sufficient to form a silicon oxide layer 60 on the front surface of the silicon wafer 10. See FIG. 3D. Oxidation of the silicon wafer 10 may be accomplished by thermal oxidation (in which some portion of the deposited semiconductor material film will be consumed) or the film may be grown by CVD oxide deposition. In some embodiments, the silicon wafer 10 may be thermally oxidized in a furnace such as an ASM A400. The temperature may range from 900° C. to 1100° C. in an oxidizing ambient, such as between about 950° C. and about 1100° C., or between about 1000° C. and about 1100° C. The anneal duration may be at least about 30 minutes, such as greater than about 60 minutes, greater than about 120 minutes, such as greater than about 180 minutes, or greater than about 240 minutes, greater than about 300 minutes, or greater than about 360 minutes.

In some embodiments, the single crystal silicon wafer is heated treated in the oxidizing atmosphere comprising the oxygen-containing gas at a temperature of between about 900° C. and about 1100° C., such as between about 900° C. and about 1000° C., for a duration at least about 30 minutes, such as greater than about 60 minutes, greater than about 120 minutes, such as greater than about 180 minutes, or greater than about 240 minutes, greater than about 300 minutes, or greater than about 360 minutes, such as between about 30 minutes and about 360 minutes, or between about 60 minutes and about 360 minutes, or between about 1200 minutes and about 360 minutes. In some embodiments, the single crystal silicon wafer is heated treated in the oxidizing atmosphere comprising the oxygen-containing gas at a temperature of between about 950° C. and about 1100° C., such as between about 950° C. and about 1050° C., for a duration at least about 30 minutes, such as greater than about 60 minutes, such as greater than 120 minutes, such as greater than 180 minutes, or greater than 240 minutes, greater than 300 minutes, or greater than about 360 minutes, such as between about 30 minutes and about 360 minutes, or between about 60 minutes and about 360 minutes, or between about 1200 minutes and about 360 minutes. In some embodiments, the single crystal silicon wafer is heated treated in the oxidizing atmosphere comprising the oxygen-containing gas at a temperature of between about 1000° C. and about 1100° C., such as between about 1050° C. and about 1100° C., for a duration at least about 30 minutes, such as greater than about 60 minutes, greater than about 120 minutes, such as greater than about 180 minutes, or greater than about 240 minutes, greater than about 300 minutes, or greater than about 360 minutes, such as between about 30 minutes and about 360 minutes, or between about 60 minutes and about 360 minutes, or between about 1200 minutes and about 360 minutes. The oxidizing ambient atmosphere can be a mixture of inert gas, such as Ar or $N_2$, and $O_2$. The oxygen content may vary from 1 to 10 percent, or higher. In some embodiments, the oxidizing ambient atmosphere may be up to 100% (a "dry oxidation"). In some embodiments, the ambient atmosphere may comprise a mixture of inert gas, such as Ar or $N_2$, and oxidizing gases, such as $O_2$ and water vapor (a "wet oxidation"). In an exemplary embodiment, silicon wafer 10 may be loaded into a vertical furnace, such as an A400. The temperature is ramped to the oxidizing temperature and an appropriate oxidative gas, e.g., $O_2$, is flowed into the furnace. Various gas condition for oxidation may be used to generate oxide layer, such as a combination of $N_2$ (4 slm) and $O_2$ (20 slm). After the desired oxide thickness has been obtained, the $O_2$ is turned off and the furnace temperature is reduced and wafers are unloaded from the furnace. In general, the oxidative layer has a thickness greater than about 50 Ångströms, such as between about 50 Ångströms and about 1000 Ångströms, or between about 50 Ångströms and about 500 Ångströms. In some embodiments, an oxidative anneal at a temperature of about 900° C. for about 0.5 hours yields a silicon dioxide layer having a thickness of about 50 Ångströms or more. In some embodiments, an oxidative anneal at a temperature of about 900° C. for about 4 hours yields a silicon dioxide layer having a thickness of about 350 Ångströms or more.

The oxidative anneal is not for the purpose of growing oxygen precipitates in the bulk of the wafer. According to some embodiments of the invention, the oxygen precipitation heat treatment, e.g., NEC1 anneal, occurs after GOI yield testing. Rather, the oxidative anneal is sufficient for dissolving oxygen precipitates near the wafer surface, or for reducing the size thereof until they are non-detectable and do not contribute to GOI degradation. The oxidative anneal supplis interstitial silicon atoms from $SiO_2/Si$ interface to the wafer bulk. In order to perform a gate oxide integrity test, the silicon oxide layer 60 is removed, which may further remove the type of defects that cause degradation of the GOI yield. In some embodiments, the silicon oxide layer 60 is removed by polishing, chemical etching, or plasma etching. Techniques suitable for removing the silicon oxide layer are known in the art. Chemical etching, e.g., with HF, is sufficient to remove the silicon oxide layer, which may have a thickness in the range of 0.1 micrometer to 1 micrometer, such as about 0.5 micrometer.

Wafer cleaning and polishing is optional. If desired, the wafers can be cleaned, for example, in a standard SC1/SC2 solution. Additionally, the wafers may be subjected to chemical mechanical polishing (CMP) to reduce the surface roughness, preferably to the level of $RMS_{2\times2\ \mu m2}$ is less than about 5 angstroms, such as between about 1 angstrom and about 2 angstroms, wherein root mean squared—

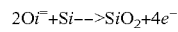

$$R_q = \sqrt{\frac{1}{n}\sum_{i=1}^{n} y_i^2},$$

the roughness profile contains ordered, equally spaced points along the trace, and $y_i$ is the vertical distance from the mean line to the data point. At a surface roughness of preferably less than 2 angstroms, the surface is ready for bonding.

IV. Gate Oxide Integrity Yield

According to the method of the present invention, gate oxide integrity degradation caused by the rapid thermal anneal in a nitrogen gas containing ambient atmosphere is recovered by the oxidative anneal, which eliminates GOI defect sources. The oxidative anneal enhances the out-diffusion of nitrogen and further alters the size of as-grown oxygen precipitates.

The formation of a silicon oxide layer at the wafer surface generates interstitial silicon and consumes vacancies. During formation of a silicon oxide layer, the following reaction occurs:

$$2Oi^- + Si \longrightarrow SiO_2 + 4e^-$$

This reaction involving interstitial silicon and the possibility of a creating a free self-interstitial would be greatest for the $Si_I$—O pair, were it to dissociate before $SiO_2$ is formed. It has been estimated that such an incomplete oxidation step occurs for 1 silicon atom out of 1000. The formation rate of silicon self-interstitials may be calculated by the oxidation rate and the surface regrowth rate.

Figure 4:
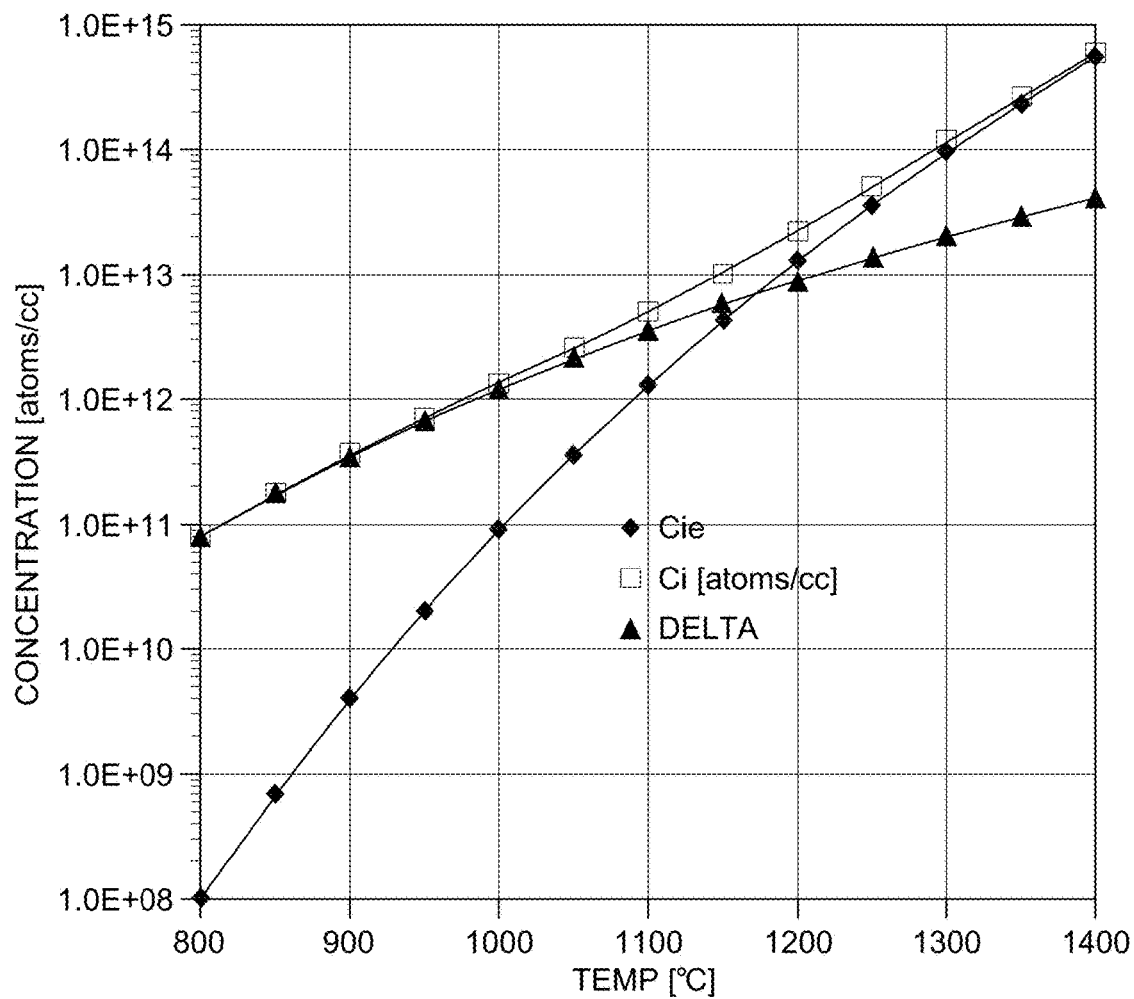
FIG. 4 is a graph showing the calculated concentration of silicon interstitials by oxidation as a function of temperature.

FIG. 4 is a graph demonstrating the concentration of silicon interstitial is increased by elevating temperature, because both oxidation rate and surface regrowth rate are increased by temperature. Therefore, diffusion controlled injection of silicon interstitial is increased at wafer surface, if oxidation temperature is increased. In-diffusion of silicon interstitial causes super-saturation of Interstitial and under-saturation of vacancies during a high temperature oxidative anneal. The high temperature oxidative anneal may contribute to dissociation of as-grown precipitate by altering the equilibrium point defect concentration or suppressing the growth of as-grown oxygen precipitate during oxidation. If sufficient interstitial is continuously injected and annealing time is long enough to dissociate precipitate, the oxygen precipitates may decrease in size or be completely dissolved. Oxidative anneal thereby removes the source of GOI defect caused by rapid thermal anneal in a nitriding ambient atmosphere or mitigate the effect of as-grown precipitate combined with nitrogen.

Gate oxide integrity yield may be measured by the Time Zero Dielectric Breakdown (TZDB) test method for the reliability of gate oxide in MOS device. The test method measures applied voltage per oxide thickness in a gate oxide. Gate oxide (transistor structure: Source-gate-drain by N-P-N or P-N-P) is an electrically insulating layer to control minority carrier channel below gate oxide between Source and drain. The formation of channel or not is decided by applied bias to gate. Channel or not means 1 or 0, and gate bias controls 1 or 0. If the gate oxide is not electrically insulating, the channel between source and drain is not controlled by gate bias. So, the oxide layer at gate is important for normal transistor operation. Gate oxide integrity testing occurs by changing of applied bias, which enables evaluation of the reliability of electric insulation. TZDB is the test method to check breakdown of oxide layer by increasing bias from 0 V to a voltage sufficient to break down the electrical insulation. If the gate oxide breakdown takes place at 9 MV/cm (Mega volt per cm) or higher voltage or if no breakdown occurs during the test, the wafer surface has good quality condition for gate in that the wafer surface does not have the sources which produce the gate oxide degradation.

Figure 5:
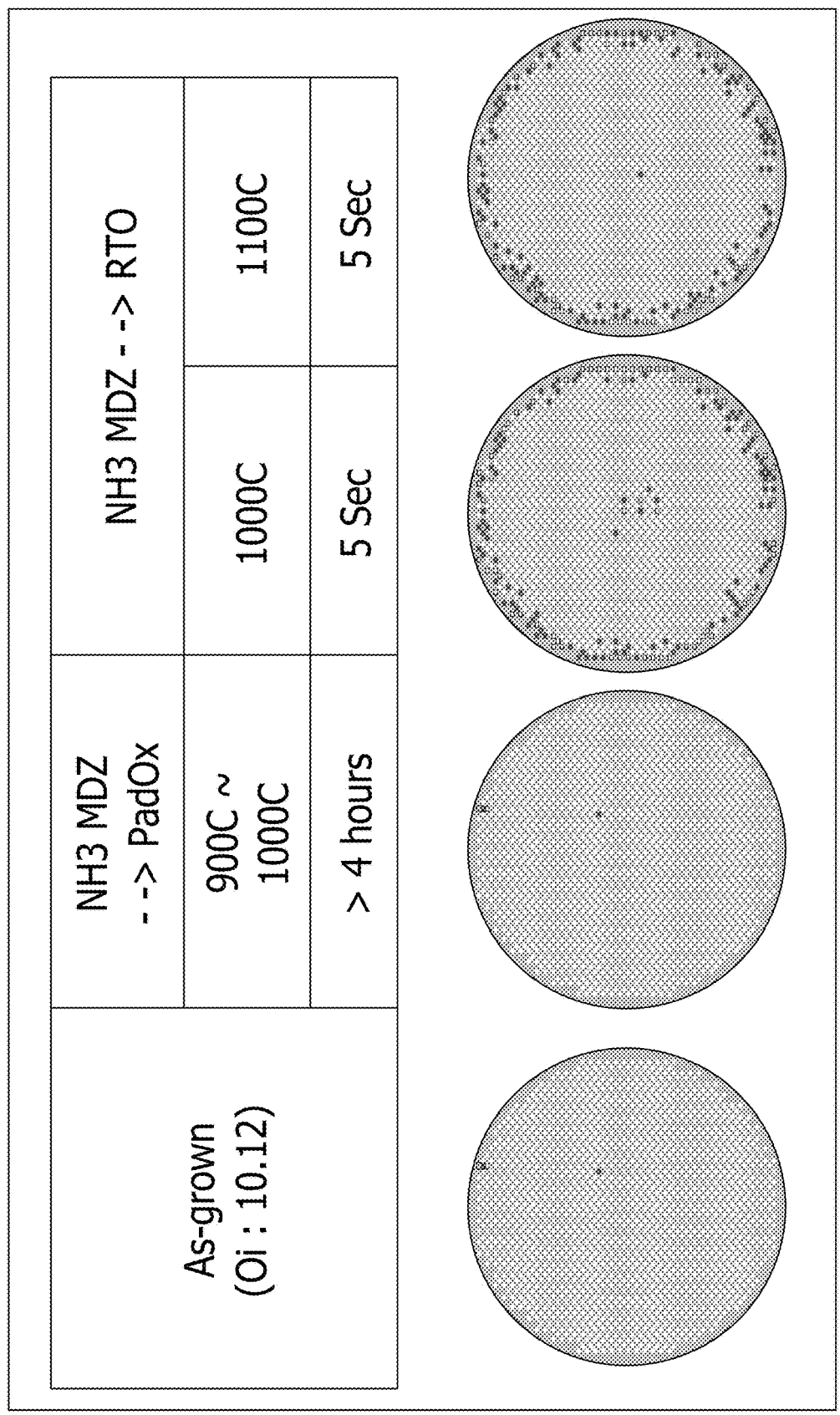
FIG. 5 provides several images of wafers after GOI integrity testing.

The impact on GOI yield may be observed with reference to FIG. 5, which depicts GOI yield for an as grown wafer (wafer on the far left), a wafer subjected to a long duration oxidative anneal (wafer second from left), and for two wafers subjected to rapid thermal anneals in oxidative ambient atmospheres (right). As can be seen in FIG. 5, the long duration yield in an oxidative ambient sufficiently improves GOI yield, but the rapid thermal anneals were not sufficient, as evidenced by the pattern of gate oxide integrity degradation defects.

Figure 6A:
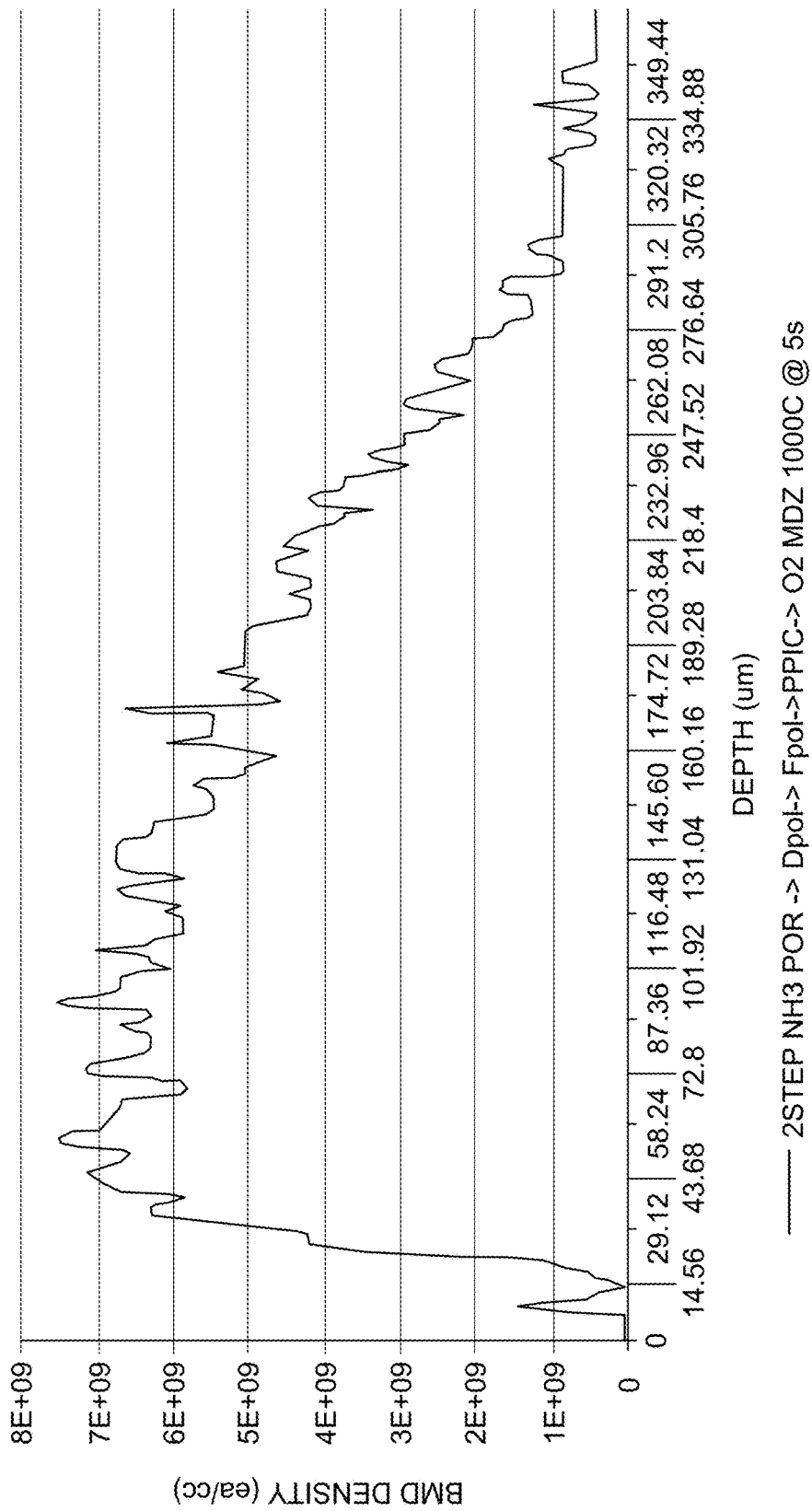
FIG. 6A depicts BMD depth profile (after an oxidation precipitation heat treatment; NEC1 treatment 4 hours at 800° C., followed by 16 hours at 1000° C.) for a wafer subjected to a rapid thermal anneal in an environment comprising ammonia, followed by an oxidative environment (1000° C. for 5 sec). The x-axis scale is depth in micrometers, and the y-axis scale is BMD/cm$^3$.
Figure 6B:
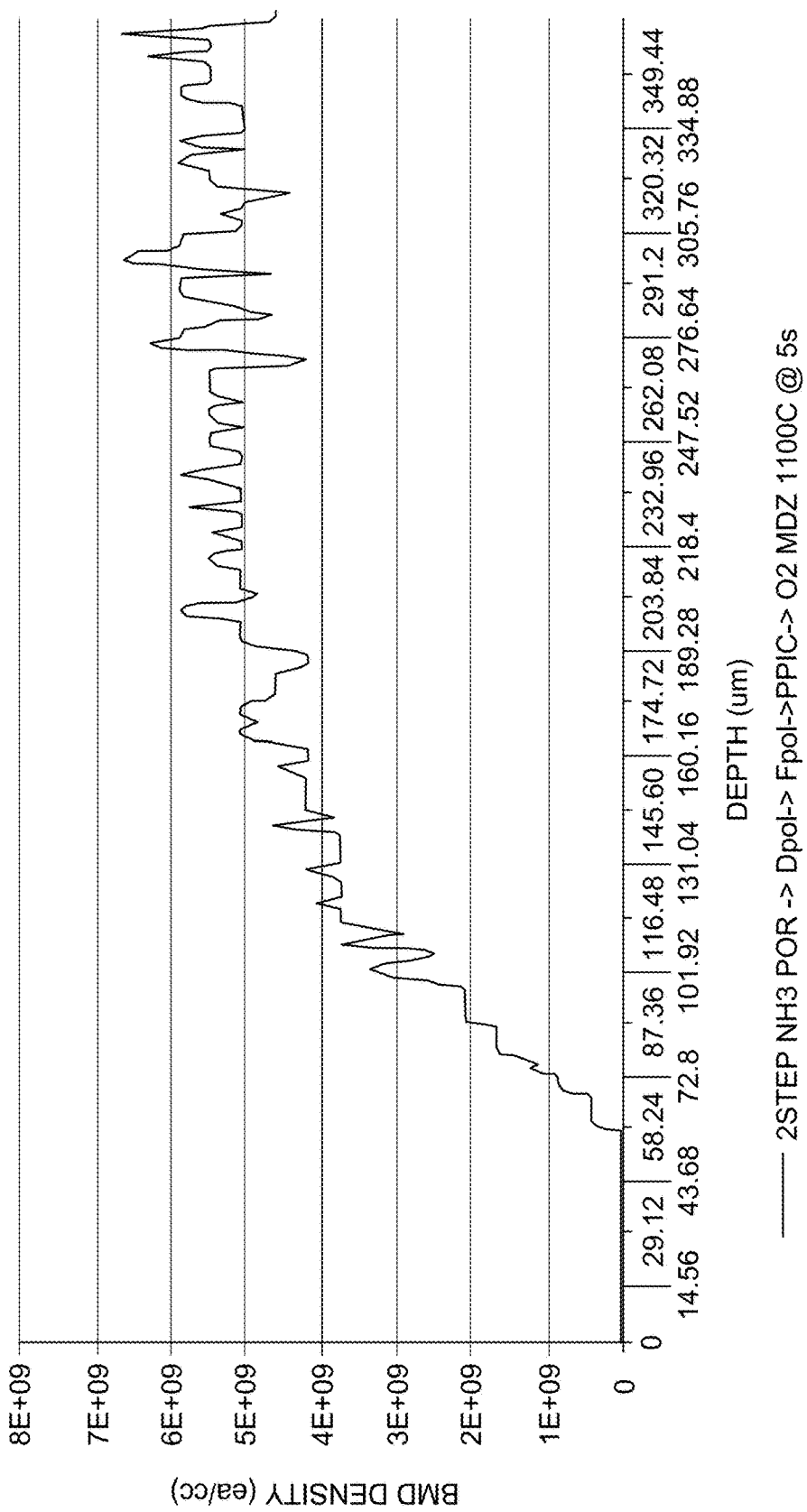
FIG. 6B depicts BMD depth profile (after an oxidation precipitation heat treatment 800° C. 4 hours+1000° C. 16 hours) for a wafer subjected to a rapid thermal anneal in an environment comprising ammonia, followed by an oxidative environment (1100° C. for 5 sec). The x-axis scale is depth in micrometers, and the y-axis scale is BMD/cm$^3$.
Figure 6C:
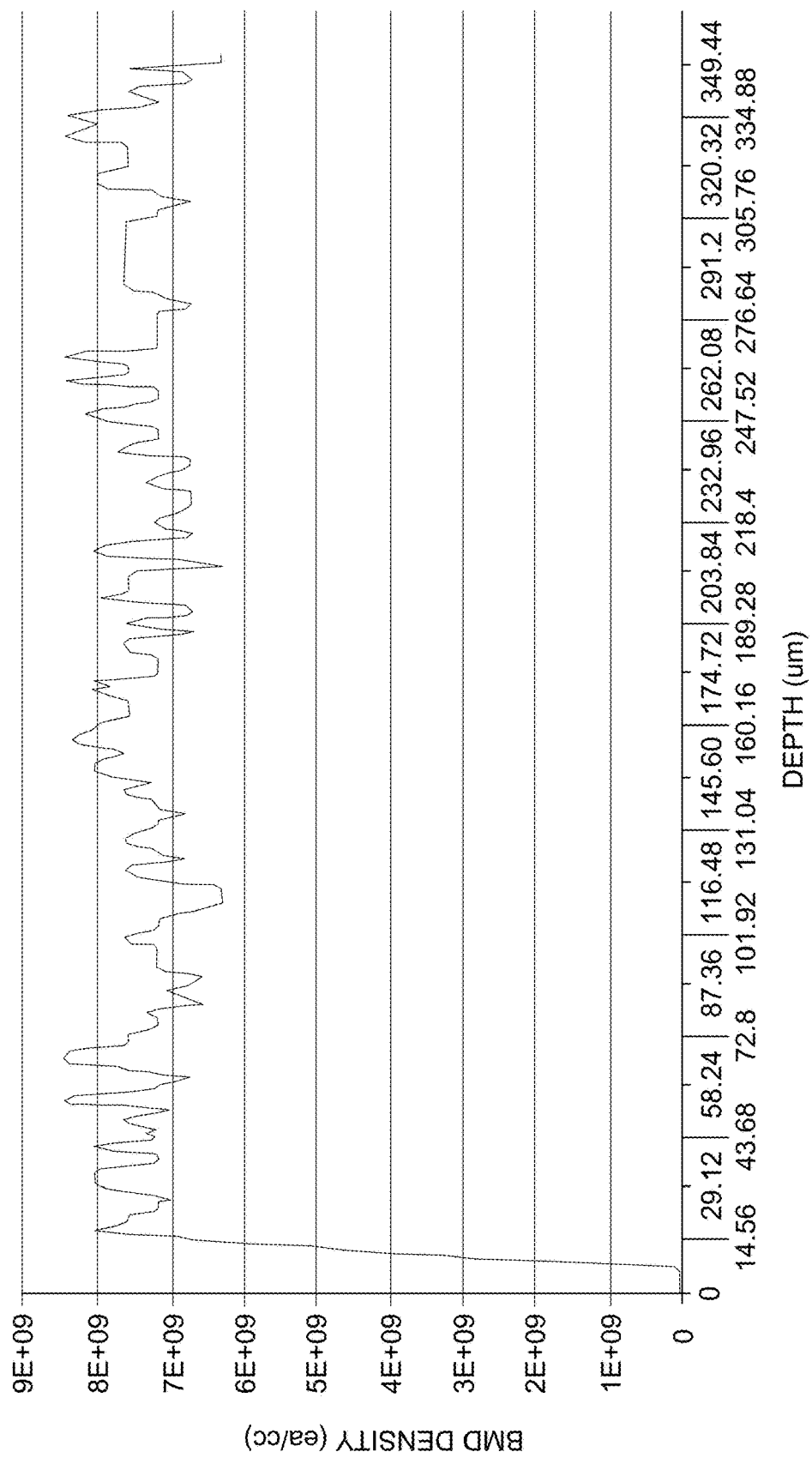
FIG. 6C depicts BMD depth profile (after an oxidation precipitation heat treatment 800° C. 4 hours+1000° C. 16 hours) for a wafer subjected to a long duration oxidative anneal between 900~1000° C. for 4 hours. The x-axis scale is depth in micrometers, and the y-axis scale is BMD/cm$^3$.

In addition, FIGS. 6A, 6B, and 6C show that the long duration oxidative anneal enables retention of high concentration of BMD throughout the bulk region of the wafer and retention of a shallow precipitate free zone depth after an anneal suitable for growing BMD in the wafer bulk. The rapid thermal anneals caused a decrease in BMD concentration and an increase in the depth of the precipitate free zone. FIG. 6A depicts BMD depth profile (after an oxidation precipitation heat treatment; NEC1 treatment 4 hours at 800° C., followed by 16 hours at 1000° C.) for a wafer subjected to a rapid thermal anneal in an environment comprising ammonia, followed by an oxidative environment (1000° C. for 5 sec). FIG. 6B depicts BMD depth profile (after an oxidation precipitation heat treatment 800° C. 4 hours+ 1000° C. 16 hours) for a wafer subjected to a rapid thermal anneal in an environment comprising ammonia, followed by an oxidative environment (1100° C. for 5 sec). FIG. 6C depicts BMD depth profile (after an oxidation precipitation heat treatment 800° C. 4 hours+1000° C. 16 hours) for a wafer subjected to a long duration oxidative anneal between 900~1000° C. for 4 hours.

Figure 7:
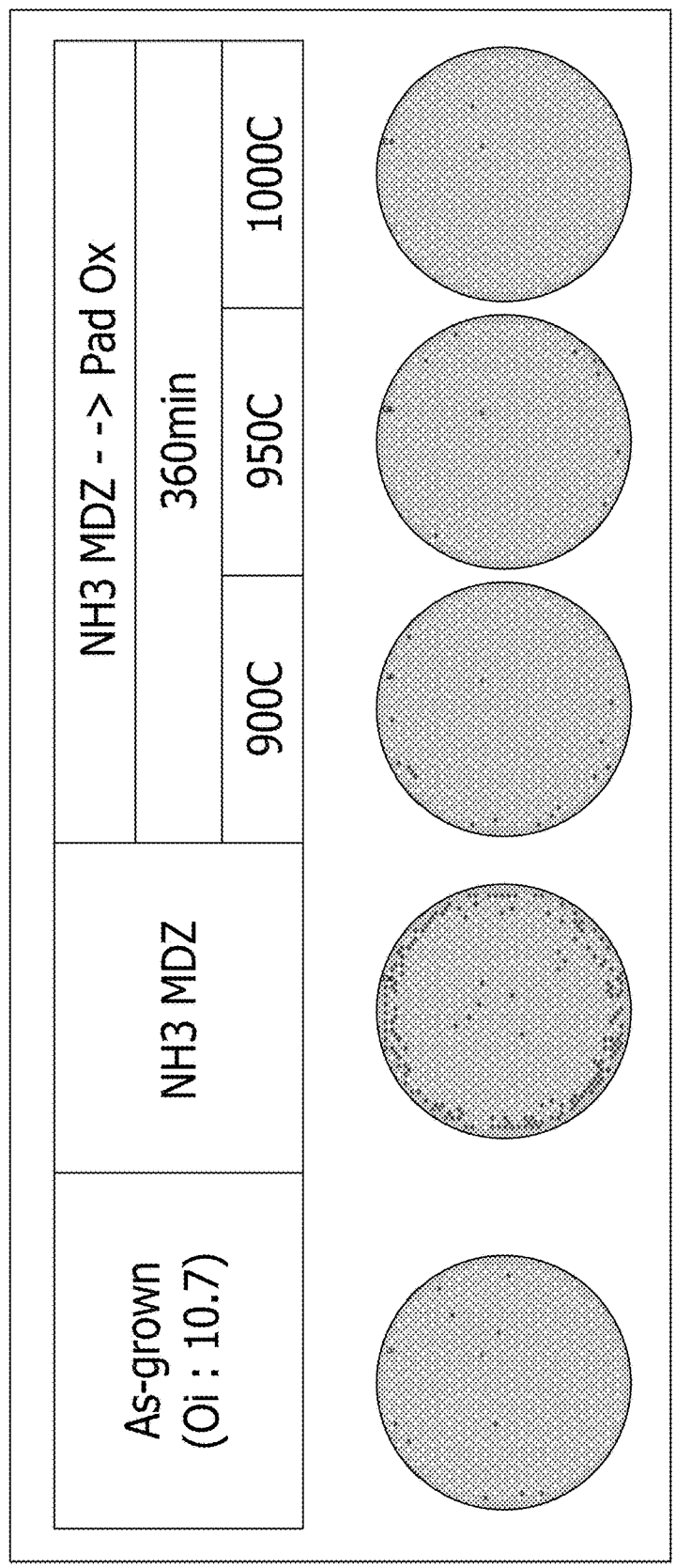
FIG. 7 depicts GOI integrity results for various wafers subjected to long duration oxidative anneal at several temperatures. The wafers depicted include the as-grown wafer (wafer on the far left), the wafer after rapid thermal anneal in a nitriding environment (wafer second from left), and three wafers (on the right) subjected to 360 minutes of oxidative anneal at 900° C., 950° C., and 1000° C.

According to some embodiments of the invention, the defects (e.g., oxygen precipitates) become non-detectable at the wafer surface. As shown in FIG. 6C, no detectable defects are observed from surface to ~10 um depth, even if heat treatment for nucleation and growth of oxygen precipitate was applied. FIG. 7 depicts GOI integrity results for various wafers subjected to long duration oxidative anneal at several temperatures. The wafers depicted include the as-grown wafer (wafer on the far left), the wafer after rapid thermal anneal in a nitriding environment (wafer second from left), and three wafers subjected to 360 minutes of oxidative anneal at 900° C., 950° C., and 1000° C. As shown in FIG. 7, long duration oxidative anneal is effective to enhance GOI yield at several temperatures, as evidenced by the lack of a pattern of gate oxide integrity degradation defects.

Figure 8:
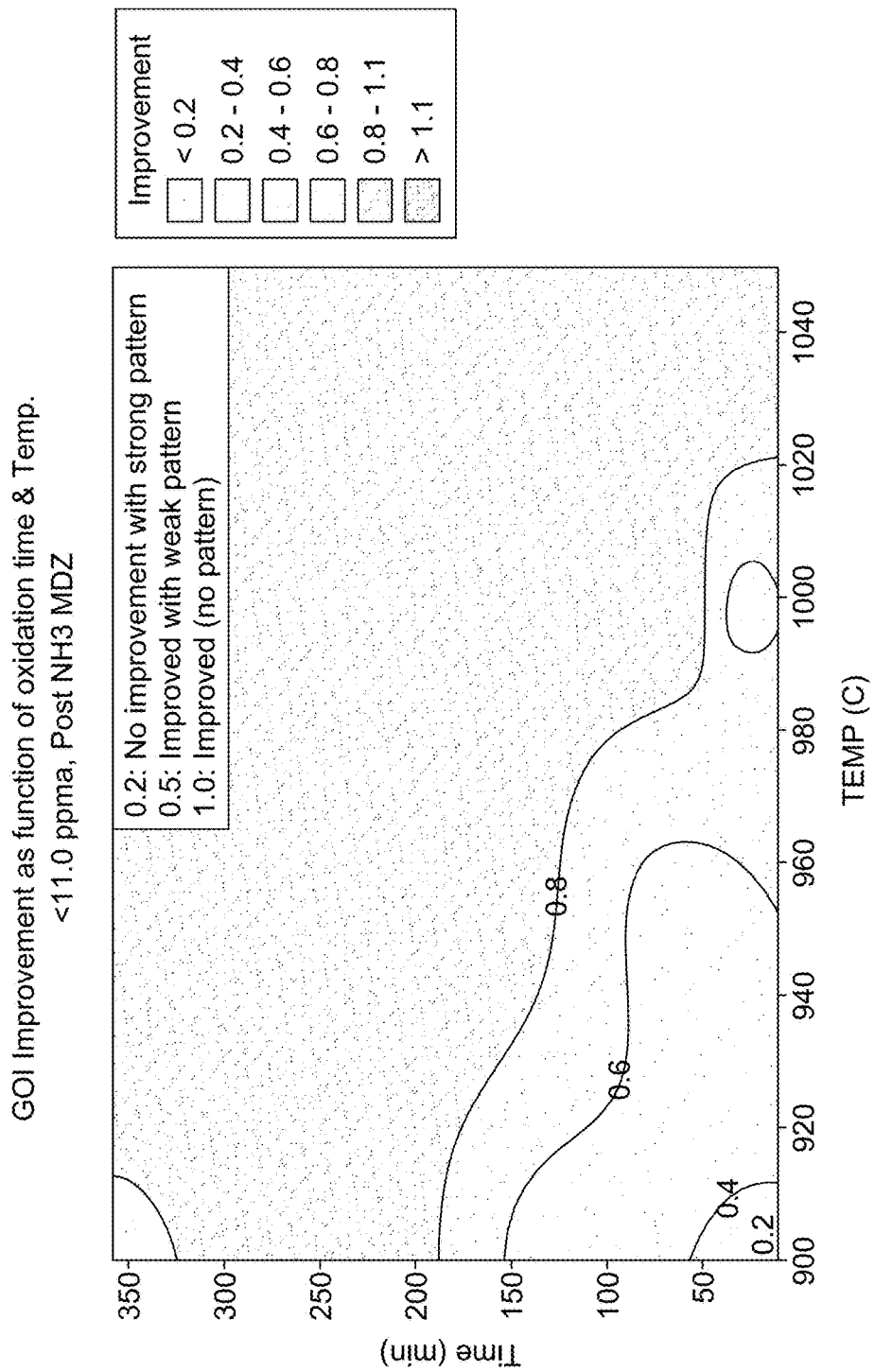
FIG. 8 is a contour plot of GOI improvement as a function of oxidation temperature and time.

Empirical results to date provided data sufficient to prepare the contour plot depicted in FIG. 8, which depicts duration and temperature sufficient to achieve gate oxide integrity yield improvement for silicon wafers after they are subjected to a rapid thermal anneal in a nitriding ambient atmosphere. The present invention is directed to a method for the generation of the M-shape BMD depth profile associated with rapid thermal anneal in a nitriding ambient atmosphere. In such a profile, the peak BMD density occurs near the front surface layer, and the front surface layer comprises a precipitate free denuded zone having a depth generally less than about 40 micrometers, less than about 30 micrometers, or even less than about 20 micrometers, such as between about 10 micrometers and about 20 micrometers. The oxidative anneal restores the GOI yield of the surface of the wafer.

According to the current theory to date, the formation of $SiO_2$ layer at wafer surface generates the interstitial silicon by consuming vacancies, and the interstitial silicon atoms injected are expected to dissolve or decrease the size of as-grown oxygen precipitate by crystal growth and will consume supersaturated vacancies generated by rapid thermal anneal in a nitriding atmosphere at a certain depth from wafer surface. GOI failure free perfect silicon was used as input materials and various temperature and time condition for oxidation were tested to find out minimum oxidation details. GOI yield was degraded after rapid thermal anneal in a nitriding atmosphere even if the input material is good for GOI. According to the method of the present invention, a oxidative anneal after removal of the silicon nitride layer which results from the rapid thermal anneal improves the degraded GOI yield over a variety of oxidative anneal durations and temperatures. See FIG. 8. Higher oxidation temperature and longer anneal duration were suitable in removing the GOI defect because density and diffusion length of the injected interstitials is increased in the interface between oxide and wafer. Therefore, our test results in this invention disclosure are well matched with the hypotheses and it was confirmed that oxidation is a practical (economical) method solving GOI degradation problem after rapid thermal anneal without any change of peak BMD density and shallow PFZ.

V. Oxygen Precipitation Heat Treatment

Any thermal treatment sufficient to nucleate and grow oxygen precipitates is suitable for preparing wafers of the present invention. In some embodiments, the wafers are subjected to an oxygen precipitation heat-treatment at a temperature in excess of about 700° C. for a duration sufficient to nucleate and grow oxygen precipitates. In some embodiments, the wafers are subjected to an oxygen precipitation heat treatment comprising the NEC1 test procedure, e.g., annealing the wafer for 4-8 hours at 800° C. and then 16 hours at 1000° C. In some embodiments, the oxygen precipitation heat treatment prepares wafers comprising oxygen precipitates at an average concentration from the central axis to the circumferential edge of at least about $1 \times 10^7$ precipitates/cm$^3$, or at least about $1 \times 10^8$ precipitates/cm$^3$. In some embodiments, the oxygen precipitation heat treatment prepares wafers comprising oxygen precipitates at an average concentration from the central axis to the circumferential edge of at least about $5 \times 10^8$ precipitates/cm$^3$. In some embodiments, the oxygen precipitation heat treatment prepares wafers comprising oxygen precipitates at an average concentration from the central axis to the circumferential edge of at least about $1 \times 10^9$ precipitates/cm$^3$. In some embodiments, the oxygen precipitation heat treatment prepares wafers comprising oxygen precipitates at an average concentration from the central axis to the circumferential edge of at least about $5 \times 10^9$ precipitates/cm$^3$. In some embodiments, the oxygen precipitation heat treatment prepares wafers comprising oxygen precipitates at an average concentration from the central axis to the circumferential edge of at least about $1 \times 10^{10}$ precipitates/cm$^3$. Within the bulk region, the depth of peak concentration of oxygen precipitates occurring within about 10 to about 100 micrometers of the surface, such as from about 20 to about 100 micrometers of the surface, such as between about 20 to about 50 micrometers, such as between 20 to about 30 micrometers, or between about 10 micrometers and about 20 micrometers of the surface.

The process of the present invention thereby prepares a silicon wafer having a precipitate free zone in the front surface layer and a bulk region comprising oxygen precipitates. The depth, D, of the front surface layer comprising the precipitate free zone may be less than about 40 micrometers, less than about 30 micrometers, less than about 20 micrometers, less than about 15 micrometers, or even less than about 10 micrometers. In some embodiments, depth, D, of the front surface layer comprising the precipitate free zone may be at least about 1 micrometer, at least about 3 micrometers, or at least about 5 micrometers, as measured from the front surface of the wafer and toward the central plane. Wafers having an essential absence of oxygen precipitate nucleation centers shall mean wafers which, upon being annealed at a temperature of 800° C. for four hours and then at a temperature of 1000° C. for sixteen hours has less than $10^7$ oxygen precipitates/cm$^3$, or less than $10^6$ oxygen precipitates/cm$^3$. The process of the present invention is sufficient to dissolve small grown-in oxygen precipitates near wafer surface and further decreases the size of undissolved grown-in oxygen precipitate. Accordingly, the density of oxygen precipitate is decreased for both detectable and non-detectable sizes. Accordingly, in some embodiments, the front surface layer essentially lacks oxygen precipitates. The method of the present invention enables preparation of a wafer comprising a front surface that has no gate oxide integrity pattern related crystal defect bands. That is, the front surface lacks the type of defects that degrade GOI, as measured by a standard test.

VI. Post-Process of Wafers

Silicon wafers of the present invention may be used in a variety of applications. For example, such wafers having a bare silicon surface polished to a specular finish (i.e., a polished wafer) may be used directly in an integrated circuit manufacturing process. Alternatively, the wafer may be used as a substrate for epitaxial deposition or SOI (by layer transfer or oxygen implantation).

1. Etching

If desired, the near-surface region of the wafers, e.g., generally up to about 2 micrometers, may be substantially, or even entirely, removed by chemical etching using etchants and techniques conventional in the art.

2. Polishing

If desired, the wafer may be chemically or chemomechanically polished to a specular finish prior to or after oxygen precipitation.

3. Epitaxial Layer

The wafer may be prepared for epitaxial layer deposition. If an epitaxial layer is to be deposited on the wafer, the process of the present invention may be carried out either before or after the epitaxial deposition. If carried out before, it may be desirable to stabilize the oxygen precipitate nucleation centers in the wafer after the process of the present invention and before the epitaxial deposition. If carried out after, it may be desirable to carry out the process of the present invention in the epitaxial reactor immediately after the epitaxial deposition, provided the cooling rates required by the process of the present invention can be achieved.

The epitaxial layer may be deposited onto the entire wafer, or, alternatively, onto only a portion of the wafer. The epitaxial layer preferably is deposited onto the front surface of the wafer. More preferably, it is deposited onto the entire front surface of the wafer. Whether it is preferred to have an epitaxial layer deposited onto any other portion of the wafer will depend on the intended use of the wafer. For most applications, the existence or non-existence of an epitaxial layer on any other portion of the wafer is not critical.

The wafer surfaces may comprise an oxide or nitride layer. For example, a silicon oxide layer forms on a silicon surface when it is exposed to air at room temperature and generally has a thickness of from about 10 to about 15 Å. Preferably, the nitride, oxide, or nitride/oxide layer is removed from the surface of the wafer before the epitaxial layer is deposited onto the surface.

Removal of a silicon oxide or nitride/oxide layer may be accomplished by heating the surface of the wafer in an oxidant-free atmosphere until the oxide or nitride/oxide layer is removed from the surface. For example, the surface of the wafer is preferably heated to a temperature of at least about 1100° C., and more preferably to a temperature of at least about 1150° C. This heating preferably is conducted while exposing the surface of the wafer to an atmosphere comprising $H_2$ or a noble gas (e.g., He, Ne, or Ar). More preferably, the atmosphere comprises $H_2$. Most preferably, the atmosphere consists essentially of $H_2$ because use of other atmospheres tends to cause etch pits to form in the surface of the wafer.

Generally, it is preferable to heat the wafer surface to remove the silicon oxide or nitride/oxide layer and then initiate silicon deposition less than 30 seconds (more preferably within about 10 seconds) after the oxide or nitride/oxide is removed. Generally, this may be accomplished by heating the wafer surface to a temperature of at least about 1100° C. (more preferably at least about 1150° C.) and then initiating the silicon deposition less than 30 seconds (more preferably within about 10 seconds) after the wafer surface reaches that temperature. Waiting to initiate silicon deposition for up to about 10 seconds after removal of the silicon oxide or nitride/oxide layer allows the temperature of the wafer to stabilize and become uniform.

Alternatively, the oxide or nitride/oxide layer may be chemically stripped. In embodiments where the silicon surface has a nitride/oxide layer, chemical stripping is the preferred means for removing the nitride/oxide layer. Chemical stripping may be done by means known in the art using phosphoric acid, hydrofluoric acid, or other acids as are known. In another alternative, the oxide or nitride/oxide layer may be etched by plasma etching, using, for example, eMAX from Applied Materials, or other methods as are known in the art.

In embodiments where the surface layer is predominantly a silicon nitride layer, the nitride layer may be removed by polishing, chemical etching, or plasma etching (such as eMAX from Applied Materials, or other etching methods as are known in the art).

The epitaxial deposition preferably is carried out by chemical vapor deposition. Generally speaking, chemical vapor deposition involves exposing the surface of the wafer to an atmosphere comprising silicon in an epitaxial deposition reactor, e.g., a Centura reactor available from Applied Materials. Preferably, the surface of the wafer is exposed to an atmosphere comprising a volatile gas comprising silicon (e.g., $SiCl_4$, $SiHCl_3$, $SiH_2Cl_2$, $SiH_3Cl$, or $SiH_4$). The atmosphere also preferably contains a carrier gas (preferably $H_2$). For example, the source of silicon during the epitaxial deposition may be $SiH_2Cl_2$ or $SiH_4$. If $SiH_2Cl_2$ is used, the reactor vacuum pressure during deposition preferably is from about 500 to about 760 Torr. If, on the other hand, $SiH_4$ is used, the reactor pressure preferably is about 100 Torr. Most preferably, the source of silicon during the deposition is $SiHCl_3$. This tends to be much cheaper than other sources. In addition, an epitaxial deposition using $SiHCl_3$ may be conducted at atmospheric pressure. This is advantageous because no vacuum pump is required and the reactor chamber does not have to be as robust to prevent collapse. Moreover, fewer safety hazards are presented and the chance of air or other gases leaking into the reactor chamber is lessened.

During the epitaxial deposition, the temperature of the wafer surface preferably is ramped to and maintained at a temperature sufficient to prevent the atmosphere comprising silicon from depositing polycrystalline silicon on the surface. Generally, the temperature of the surface during this period preferably is at least about 900° C. More preferably, the temperature of the surface is maintained in the range of between about 1050 and about 1150° C. Most preferably, the temperature of the surface is maintained at the silicon oxide removal temperature.

The rate of growth of the epitaxial deposition preferably is from about 0.5 to about 7.0 μm/min. A rate of about 3.5 to about 4.0 μm/min may be achieved, for example, by using an atmosphere consisting essentially of about 2.5 mole % $SiHCl_3$ and about 97.5 mole % $H_2$ at a temperature of about 1150° C. and an absolute pressure of up to about 1 atm.

In some applications, the wafers comprise an epitaxial layer which imparts electrical properties. In some embodiments, the epitaxial layer is lightly doped with phosphorous. Therefore, the ambient for epitaxial deposition comprises phosphorous present as a volatile compound, such as, for example, phosphine, $PH_3$. In some embodiments, the epitaxial layer can contain boron. Such a layer may be prepared by, for example, including $B_2H_6$ in the atmosphere during the deposition.

Epitaxial deposition typically requires a post-epi cleaning step following epitaxial deposition to remove byproducts formed during the epitaxial deposition. This step is used to prevent time-dependent haze, which results if such byproducts react with air. In addition, many post-epi cleaning techniques tend to form a silicon oxide layer on the epitaxial surface which tends to passivate (i.e., protect) the surface. The epitaxial wafers of the present invention may be cleaned by methods known in the art.

4. Silicon on Insulator (SOI)

Wafers prepared in accordance with embodiments of the present disclosure may also be incorporated into a silicon on insulator structure. A silicon on insulator structure generally comprises a device layer, a handle wafer or supporting layer, and an insulating film or layer (typically an oxide layer) between the supporting layer and the device layer. Generally, the device layer is between about 0.5 and about 20 μm thick. Silicon on insulator structures may be prepared using various techniques known in the art, as further described herein below.

If the support layer of the SOI structure comprises or is derived from a wafer of the present disclosure, preferably the process (e.g., creating a template for oxygen precipitation and activation of inactive oxygen precipitate nuclei) will be carried out before the device layer of the SOI structure has been attached to the handle wafer (or, in the case of ion implantation processes, before implantation occurs). If the present process is carried out prior to formation of the SOI structure, it may be desirable to stabilize the oxygen precipitate nucleation centers in the handle wafer after the process is complete and before preparation of the SOI structure begins. Additionally, if this approach is employed, the oxygen precipitation heat treatment of step $S_2$ may, in some embodiments, be achieved during formation of the SOI structure (such as in the case of wafer bonding), provided the treatment time and temperature employed by the SOI process are sufficient for oxygen precipitate formation.

It is to be further noted, however, that the present silicon wafer process may also be performed after the SOI structure has been prepared. Without being held to any particular theory, it is believed that the SOI structure will behave as a typical single crystal silicon wafer, with the oxide layer acting as a free surface from which vacancies and self-interstitials may be injected and to which they may diffuse.

SOI structures may be prepared, for example, by the SIMOX process by subjecting the wafer of the present disclosure to an ion implantation process which, as noted above, is standard in the art as disclosed in U.S. Pat. No. 5,436,175 and Plasma Immersion Ion Implantation for Semiconductor Processing, Materials Chemistry and Physics 46 (1996) 132-139, both of which are incorporated herein by reference for all relevant and consistent purposes. In such a process, the ions are implanted into a silicon wafer substrate which is then subjected to a high temperature anneal to form a buried oxide, insulating layer. If, for example, oxygen ions are implanted, a buried insulating layer of silicon dioxide ($SiO_2$) is formed. If nitrogen atoms are implanted, a buried layer of silicon nitride ($Si_3N_4$) is formed. In such instances, the resulting SOI structure comprises a device layer and an insulating layer, both derived from a wafer produced by a method of the present disclosure. Because of the high temperature oxide formation anneal, typically about 1150° C. to about 1400° C., oxygen solubility exceeds the typical oxygen concentration in the wafer so that preexisting precipitates may dissolve back into interstitial oxygen. In such instances, for some application an oxygen reduction secondary anneal may be performed following the SIMOX process. This embodiment, then, typically comprises performing the rapid thermal anneal and cooling process on a single crystal silicon wafer having essentially any oxygen concentration attainable using Cz crystal pulling techniques; forming an oxide insulating layer in the wafer; and performing a secondary anneal at a temperature in the range of about 700° C. to about 1100° C.

SOI structures may also be prepared by bonding two wafers and removing a portion of one of the bonded wafers. For example, SOI structures can be prepared by the BESOI process, wherein the wafer of the present disclosure is bonded to another wafer, and then a substantial portion of one of the wafers is etched away using known wafer thinning techniques to obtain the device layer as disclosed in U.S. Pat. Nos. 5,024,723 and 5,189,500, each of which is incorporated herein by reference for all relevant and consistent purposes. In this instance, the resulting SOI structure comprises (i) a device layer, (ii) a handle wafer or supporting layer, and (iii) an insulating layer between the device layer and the support layer.

In an alternative wafer bonding approach, hydrogen or another ion is implanted into one of the wafers and, after the two wafers are bonded, the bonded composite is subjected to a force which causes the bonded composite to cleave at the implantation site. For example, a SOI structure may be prepared by (1) the implantation of ions (e.g., hydrogen, nitrogen, etc.) in a wafer of the present disclosure by bombardment to produce a layer of gaseous microbubbles, while keeping the temperature below the temperature at which the gaseous microbubbles can escape therefrom by diffusion, (2) contacting the planar face of the wafer with a stiffener to form a bonded composite, and (3) subjecting the bonded composite to a thermal or mechanical stress which causes the wafer of the present disclosure to delaminate in the region of ion implantation. If thermal stress is used, the composite is heated to a temperature above that which the implantation of ions occurred in order to create a crystalline rearrangement and a pressure effect in the microbubbles resulting in a separation between the thin semiconductor film and the majority of the substrate as disclosed in U.S. Pat. No. 5,374,564 which is incorporated herein by reference for all relevant and consistent purposes. If the SOI structure is to comprise a wafer of the present disclosure as a stiffener, in one or more embodiments, the wafer is subjected to the ideal precipitating process described above before bonding to the planar face of the other wafer. In other embodiments, the low defect density silicon wafer may first be bound to a Czochralski-type single crystal silicon wafer, and then the entire SOI structure may be subjected to the ideal precipitating process and nuclei activation process described above.

In view of the above, it will be seen that the several objects of the invention are achieved.

This written description uses examples to disclose the invention, including the best mode, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A method of treating a single crystal silicon wafer, the method comprising:
    heat treating the single crystal silicon wafer in a first ambient atmosphere comprising a nitrogen-containing gas at a temperature of at least about 1100° C. to increase a density of crystal lattice vacancies in a bulk region of the single crystal silicon wafer and to form a silicon nitride layer on a front surface of the single crystal silicon wafer, wherein the single crystal silicon wafer comprises two major, parallel surfaces, one of which is the front surface and one of which is a back surface, a central plane between the front surface and the back surface, a circumferential edge joining the front surface and the back surface, a front surface layer having a depth, D, measured from the front surface and toward the central plane, and wherein the bulk region is between the front surface layer and the central plane;
    removing the silicon nitride layer from the front surface of the single crystal silicon wafer;
    heat treating the single crystal silicon wafer in a second ambient atmosphere comprising oxygen and a temperature between about 900° C. and about 1100° C. for a duration greater than 30 minutes to form a silicon oxide layer on the front surface of the single crystal silicon wafer having a minimum thickness of at least about 50 Angstroms; and
    removing the silicon oxide layer from the front surface of the single crystal silicon wafer;
    wherein the single crystal silicon wafer is heated treated in the first ambient atmosphere comprising the nitrogen-containing gas at a temperature of between about 1100° C. and about 1200° C. for a duration between about 1 second and about 60 seconds, and then heated treated in the first ambient atmosphere comprising the nitrogen-containing gas at a temperature of between about 1200° C. and about 1300° C. for a duration between about 1 second and about 60 seconds; and
    wherein the front surface layer comprises oxygen precipitates at a density of less than about $1 \times 10^7$ cm$^{-3}$ after heat treating in the second ambient atmosphere comprising oxygen, and further wherein the depth, D, of the front surface layer is less than about 5 micrometers.

2. The process of claim 1 wherein the first ambient atmosphere comprising the nitrogen-containing gas comprises nitrogen, ammonia, or a combination of nitrogen and ammonia.

3. The process of claim 1 wherein the single crystal silicon wafer is heated treated in the first ambient atmosphere comprising the nitrogen-containing gas at a temperature of at least about 1100° C. for a duration between about 1 second and about 120 seconds.

4. The process of claim 1 wherein the single crystal silicon wafer is heated treated in the first ambient atmosphere comprising the nitrogen-containing gas at a temperature of at least about 1100° C. for a duration between about 1 second and about 60 seconds.

5. The process of claim 1 wherein the silicon nitride layer is removed by polishing, chemical etching, or plasma etching.

6. The process of claim 1 wherein the second ambient atmosphere comprising the oxygen-containing gas comprises oxygen, steam, or a combination of oxygen and steam.

7. The process of claim 1 wherein the single crystal silicon wafer is heated treated in the second ambient atmosphere comprising the oxygen-containing gas at a temperature of between about 900° C. and about 1100° C. for a duration greater than 120 minutes.

8. The process of claim 1 wherein the single crystal silicon wafer is heated treated in the second ambient atmosphere comprising the oxygen-containing gas at a temperature of between about 950° C. and about 1100° C. for a duration greater than 60 minutes.

9. The process of claim 1 wherein the single crystal silicon wafer is heated treated in the second ambient atmosphere comprising the oxygen-containing gas at a temperature of between about 1000° C. and about 1100° C. for a duration greater than 30 minutes.

10. The process of claim 1 wherein the bulk region comprises oxygen precipitates at a density of at least about $1 \times 10^8$ cm$^{-3}$ after heat treating in the second ambient atmosphere comprising oxygen.

11. The process of claim 1 wherein the bulk region comprises oxygen precipitates at a density of at least about $1 \times 10^9$ cm$^{-3}$ after heat treating in the second ambient atmosphere comprising oxygen.

12. The process of claim 1 wherein the bulk region comprises oxygen precipitates at a peak density of at least about $5 \times 10^9$ cm$^{-3}$ after heat treating in the second ambient atmosphere comprising oxygen.

13. The process of claim 1 wherein the front surface layer comprises oxygen precipitates at a density of less than about $1 \times 10^6$ cm$^{-3}$ after heat treating in the second ambient atmosphere comprising oxygen, and further wherein the depth, D, of the front surface layer is less than about 40 micrometers.

14. The process of claim 13 wherein the depth, D, of the front surface layer is at least about 5 micrometers.

15. The process of claim 1 wherein the silicon oxide layer is removed by polishing, chemical etching, or plasma etching.

* * * * *